United States Patent
Shimanek et al.

(10) Patent No.: US 8,134,878 B1
(45) Date of Patent: Mar. 13, 2012

(54) SIGNAL CALIBRATION FOR MEMORY INTERFACE

(75) Inventors: Schuyler E. Shimanek, Albuquerque, NM (US); Mikhail A. Wolf, Albuquerque, NM (US); Sanford L. Helton, San Jose, CA (US); John G. O'Dwyer, Maynooth (IE)

(73) Assignee: Xilinx, Inc., San Jose, CA (US)

( * ) Notice: Subject to any disclaimer, the term of this patent is extended or adjusted under 35 U.S.C. 154(b) by 247 days.

(21) Appl. No.: 12/695,099

(22) Filed: Jan. 27, 2010

Related U.S. Application Data

(60) Provisional application No. 61/148,926, filed on Jan. 31, 2009, provisional application No. 61/148,927, filed on Jan. 31, 2009.

(51) Int. Cl.
*G11C 7/00* (2006.01)

(52) U.S. Cl. ............................. 365/194; 365/233

(58) Field of Classification Search .............. 365/194, 365/233, 236
See application file for complete search history.

(56) References Cited

U.S. PATENT DOCUMENTS

| 7,138,829 B1 * | 11/2006 | Dalvi | 326/41 |
| 7,272,526 B2 * | 9/2007 | Stern | 702/106 |
| 7,376,857 B2 * | 5/2008 | Lee et al. | 713/401 |

OTHER PUBLICATIONS

U.S. Appl. No. 12/689,558, filed Jan. 19, 2010, Shimanek et al., Xilinx, Inc., 2100 Logic Drive, San Jose, CA.
U.S. Appl. No. 12/689,585, filed Jan. 19, 2010, Shimanek, et al., Xilinx, Inc., 2100 Logic Drive, San Jose, CA.
U.S. Appl. No. 12/689,604, filed Jan. 19, 2010, Flateau, Jr., et al., Xilinx, Inc., 2100 Logic Drive, San Jose, CA.
U.S. Appl. No. 12/694,615, filed Jan. 27, 2010, Shimanek, et al., Xilinx, Inc., 2100 Logic Drive, San Jose, CA.
U.S. Appl. No. 12/694,665, filed Jan. 27, 2010, Wennekamp, et al., Xilinx, Inc., 2100 Logic Drive, San Jose, CA.
U.S. Appl. No. 12/694,973, filed Jan. 27, 2010, Shimanek, et al., Xilinx, Inc., 2100 Logic Drive, San Jose, CA.
U.S. Appl. No. 12/689,636, filed Jan. 19, 2010, Wennekamp, et al., Xilinx, Inc., 2100 Logic Drive, San Jose, CA.
U.S. Appl. No. 12/693,397, filed Jan. 25, 2010, Wennekamp, et al., Xilinx, Inc., 2100 Logic Drive, San Jose, CA.
U.S. Appl. No. 12/692,771, filed Jan. 25, 2010, Flateau, Jr., et al., Xilinx, Inc., 2100 Logic Drive, San Jose, CA.
U.S. Appl. No. 12/696,672, filed Jan. 29, 2010, Shimanek, et al., Xilinx, Inc., 2100 Logic Drive, San Jose, CA.
U.S. Appl. No. 12/690,856, filed Jan. 20, 2010, Elkins, et al., Xilinx, Inc., 2100 Logic Drive, San Jose, CA.
U.S. Appl. No. 12/695,341, filed Jan. 28, 2010, Strader, et al., Xilinx, Inc., 2100 Logic Drive, San Jose, CA.
U.S. Appl. No. 12/694,656, filed Jan. 27, 2010, Elkins, et al., Xilinx, Inc., 2100 Logic Drive, San Jose, CA.

* cited by examiner

*Primary Examiner* — Son Dinh
(74) *Attorney, Agent, or Firm* — Kevin T. Cuenot

(57) ABSTRACT

A method of calibrating memory controller signals within an integrated circuit (IC) can include determining an internal delay of a clock network of the IC and generating a calibrated clock signal by applying a first delay to an uncalibrated clock signal, wherein the first delay is determined by subtracting the internal delay of the clock network of the IC from a bitperiod of the uncalibrated clock signal. The method can include determining a classification of at least one data signal according to timing of positive and negative edges of the at least one data signal in comparison with edges of the calibrated clock signal and aligning at least one of positive or negative edges of the at least one data signal to occur at midpoints between edges of the calibrated clock signal according to the classification of the at least one data signal.

20 Claims, 22 Drawing Sheets

|   | DQP | DQN | Type | Positive Edge Delay | Negative Edge Delay |
|---|---|---|---|---|---|
| 1 | 1 | 1 | P-Early, N-Late | (MTS/2)+dneg1 | dneg2-(MTS/2) |
| 2 | 0 | 1 | P-Early, N-Early | (MTS/2)+dneg1 | (MTS/2)+dpos2 |
| 3 | 10 | 1 | P-Early, N-Aligned | (MTS/2)+dneg1 | (MTS/2) |
| 4 | 1 | 10 | P-Aligned, N-Late | (MTS/2) | dneg2-(MTS/2) |
| 5 | 0 | 10 | P-Aligned, N-Early | (MTS/2) | (MTS/2)+dpos2 |
| 6 | 10 | 10 | P-Aligned, N-Aligned | (MTS/2) | (MTS/2) |
| 7 | 1 | 0 | P-Late, N-Late | dpos1-(MTS/2) | dneg2-(MTS/2) |
| 8 | 0 | 0 | P-Late, N-Early | dpos1-(MTS/2) | (MTS/2)+dpos2 |
| 9 | 10 | 0 | P-Late, N-Aligned | dpos1-(MTS/2) | (MTS/2) |

FIG. 13A
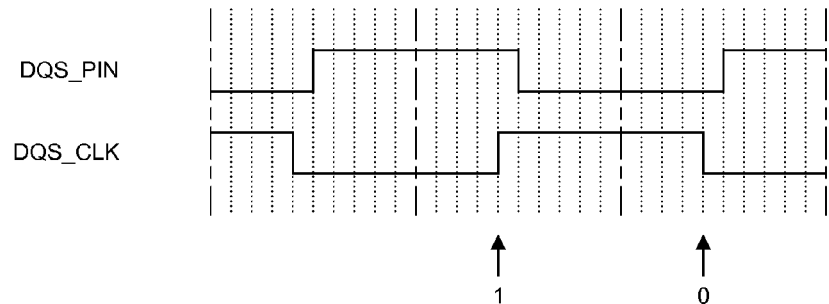
FIG. 13B
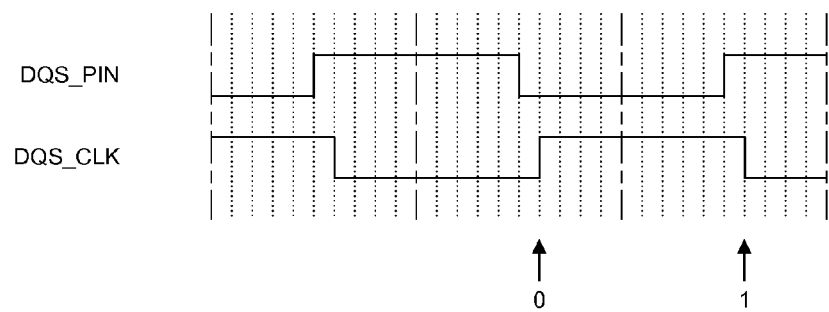
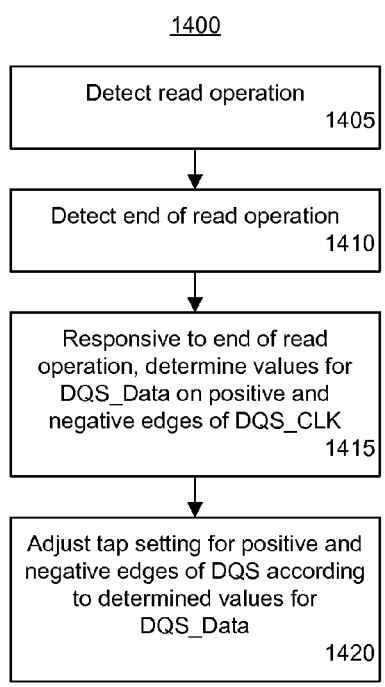
FIG. 14

| Case | DQP | DQN | DQ_ADV | DQ_DLY | Result | P-Edge | N-Edge |
|---|---|---|---|---|---|---|---|
| 1 | 0 | 0 | 0 | 0 | Valid – No Change | N/A | N/A |
| 2 | 0 | 0 | 0 | 1 | Valid – No Change | N/A | N/A |
| 3 | 0 | 0 | 1 | 0 | Valid – No Change | N/A | N/A |
| 4 | 0 | 0 | 1 | 1 | Invalid - Ignore | N/A | N/A |
| 5 | 0 | 1 | 0 | 0 | +/- 1 Tap | Increment | Decrement |
| 6 | 0 | 1 | 0 | 1 | Valid – No Change | N/A | N/A |
| 7 | 0 | 1 | 1 | 0 | Valid – No Change | N/A | N/A |
| 8 | 0 | 1 | 1 | 1 | +/- 1 Tap | Decrement | Increment |
| 9 | 1 | 0 | 0 | 0 | +/- 1 Tap | Decrement | Increment |
| 10 | 1 | 0 | 0 | 1 | Valid – No Change | N/A | N/A |
| 11 | 1 | 0 | 1 | 0 | Valid – No Change | N/A | N/A |
| 12 | 1 | 0 | 1 | 1 | +/- 1 Tap | Increment | Decrement |
| 13 | 1 | 1 | 0 | 0 | Invalid - Ignore | N/A | N/A |
| 14 | 1 | 1 | 0 | 1 | Valid – No Change | N/A | N/A |
| 15 | 1 | 1 | 1 | 0 | Valid – No Change | N/A | N/A |
| 16 | 1 | 1 | 1 | 1 | Valid – No Change | N/A | N/A |

SIGNAL CALIBRATION FOR MEMORY INTERFACE

CROSS-REFERENCE TO RELATED APPLICATIONS

This application claims benefit of U.S. Provisional patent application having the Application No. 61/148,926 filed on Jan. 31, 2009 and entitled "Apparatus and Method for a Memory Controller"; and also U.S. Provisional patent application having the Application No. 61/148,927 filed on Jan. 31, 2009 and entitled "Architecture for Advanced Integrated Circuit Providing Good Performance and Low Cost." Both of these provisional patent applications are incorporated herein by reference in their entirety.

FIELD OF THE INVENTION

One or more embodiments disclosed within this specification relate to integrated circuit devices (ICs). More particularly, one or more embodiments relate to calibrating clock and data signals within a memory interface of an IC comprising a memory controller.

BACKGROUND

Programmable integrated circuit devices (ICs) are a well-known type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

SUMMARY

One or more embodiments disclosed within this specification relate to integrated circuit devices (ICs) and, more particularly, to calibrating clock and data signals within a memory interface of an IC comprising a memory controller. One embodiment of the present invention can include a method of calibrating memory controller signals within an integrated circuit (IC). The method can include determining an internal delay of a clock network of the IC and generating a calibrated clock signal by applying a first delay to an uncalibrated clock signal, wherein the first delay is determined by subtracting the internal delay of the clock network of the IC from a bitperiod of the uncalibrated clock signal. A classification of at least one data signal can be determined according to timing of positive and negative edges of the at least one data signal in comparison with edges of the calibrated clock signal. At least one of positive and negative edges of the at least one data signal can be aligned to occur at midpoints between edges of the calibrated clock signal according to the classification of the at least one data signal.

Another embodiment of the present invention can include a method of dynamically calibrating memory controller signals within an IC. The method can include sampling an uncalibrated clock signal by clocking the sampling using a calibrated clock signal to determine at least one sampled value of the uncalibrated clock signal, wherein the calibrated clock signal is a calibrated version of the uncalibrated clock signal, and adjusting a delay applied to at least one edge of the calibrated clock signal according to the at least one sampled value.

Another embodiment of the present invention can include a method of dynamically calibrating memory controller signals within an IC. The method can include, responsive to detecting a transition of a data signal, starting a first clock counter and, responsive to detecting a transition of a calibrated clock signal, stopping the first clock counter and starting a second clock counter. The method can include selectively clearing and re-enabling the second clock counter or stopping the second clock counter according to whether a next detected transition is a transition of the data signal or a transition of the calibrated clock signal. A delay applied to the data signal can be adjusted according to the value of the first clock counter and the value of the second clock counter responsive to the next detected transition.

BRIEF DESCRIPTION OF THE DRAWINGS

FIG. 12 is a table illustrating delay to be applied to positive and negative edges of data signals according to the classifications of FIG. 10 in accordance with another embodiment of the present invention.

FIGS. 13A and 13B are signal diagrams that, taken collectively, illustrate dynamic calibration of a signal in accordance with another embodiment of the present invention.

FIG. 14 is a flow chart illustrating a method of dynamically calibrating signals in accordance with another embodiment of the present invention.

FIG. 17 is a table illustrating various states for the signals illustrated with respect to FIGS. 15 and 16 in accordance with another embodiment of the present invention.

DETAILED DESCRIPTION OF THE DRAWINGS

While the specification concludes with claims defining the features of one or more embodiments of the invention that are regarded as novel, it is believed that one or more embodiments of the invention will be better understood from a consideration of the description in conjunction with the drawings. As required, one or more detailed embodiments of the present invention are disclosed herein; however, it is to be understood that the disclosed embodiments are merely exemplary of the inventive arrangements, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the one or more embodiments of the invention.

One or more embodiments disclosed within this specification relate to integrated circuit devices (ICs) and, more particularly, to calibrating clock and data signals within a memory interface of an IC comprising a memory controller. In accordance with one or more embodiments disclosed within this specification, a variety of different calibration techniques can be implemented to properly align clock and/or data signals to increase the likelihood of error free read operations between a memory device that is external to the IC and a memory controller within the IC. The clock and data signal can be calibrated for use within the IC. It should be appreciated that one or more of the embodiments disclosed herein can be applied to calibrating signals output from the IC, e.g., signals relating to write operation to the memory device.

Once signal calibration is performed initially, calibration can be maintained dynamically. Calibration maintenance can be dynamic in the sense that alignment of clock and data signals can be performed without having to stop or interrupt the natural operation of the memory controller. By dynamically maintaining calibration of clock and data signals to and from the external memory device, misalignments between clock and data signals that manifest themselves as a consequence of temperature and voltage variations within the IC can be addressed without having to stop normal operation of the memory controller to initiate a more time consuming calibration process as is performed, for example, when the IC is powered on.

Figure 1:
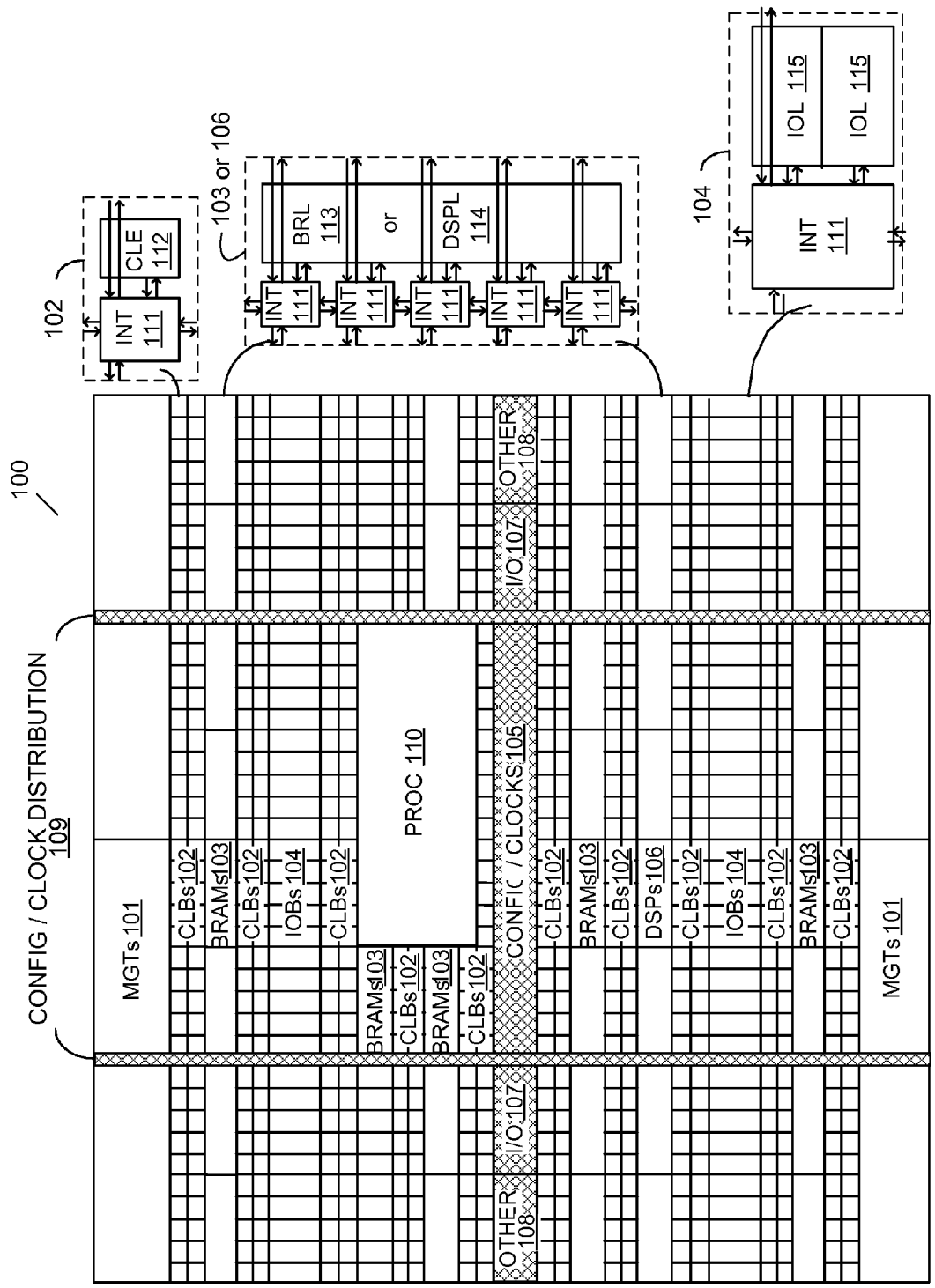
FIG. 1 is a block diagram illustrating a Field Programmable Gate Array (FPGA) architecture that includes several different types of programmable logic blocks in accordance with one embodiment of the present invention.

FIG. 1 is a block diagram illustrating a Field Programmable Gate Array (FPGA) architecture that includes several different types of programmable logic blocks in accordance with one embodiment of the present invention. Advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking circuitry (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements, taken together, implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads coupled, for example, to the I/O logic element 115 typically are not confined to the area of the input/output logic element 115.

In the pictured embodiment, a horizontal area near the center of the die (shown shaded in FIG. 1) is used for configuration, clock, and other control logic. Vertical areas 109 extending from this horizontal area are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 1 spans several columns of CLBs and BRAMs.

FIG. 1 is intended to illustrate an exemplary FPGA architecture. For example, the number of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2:
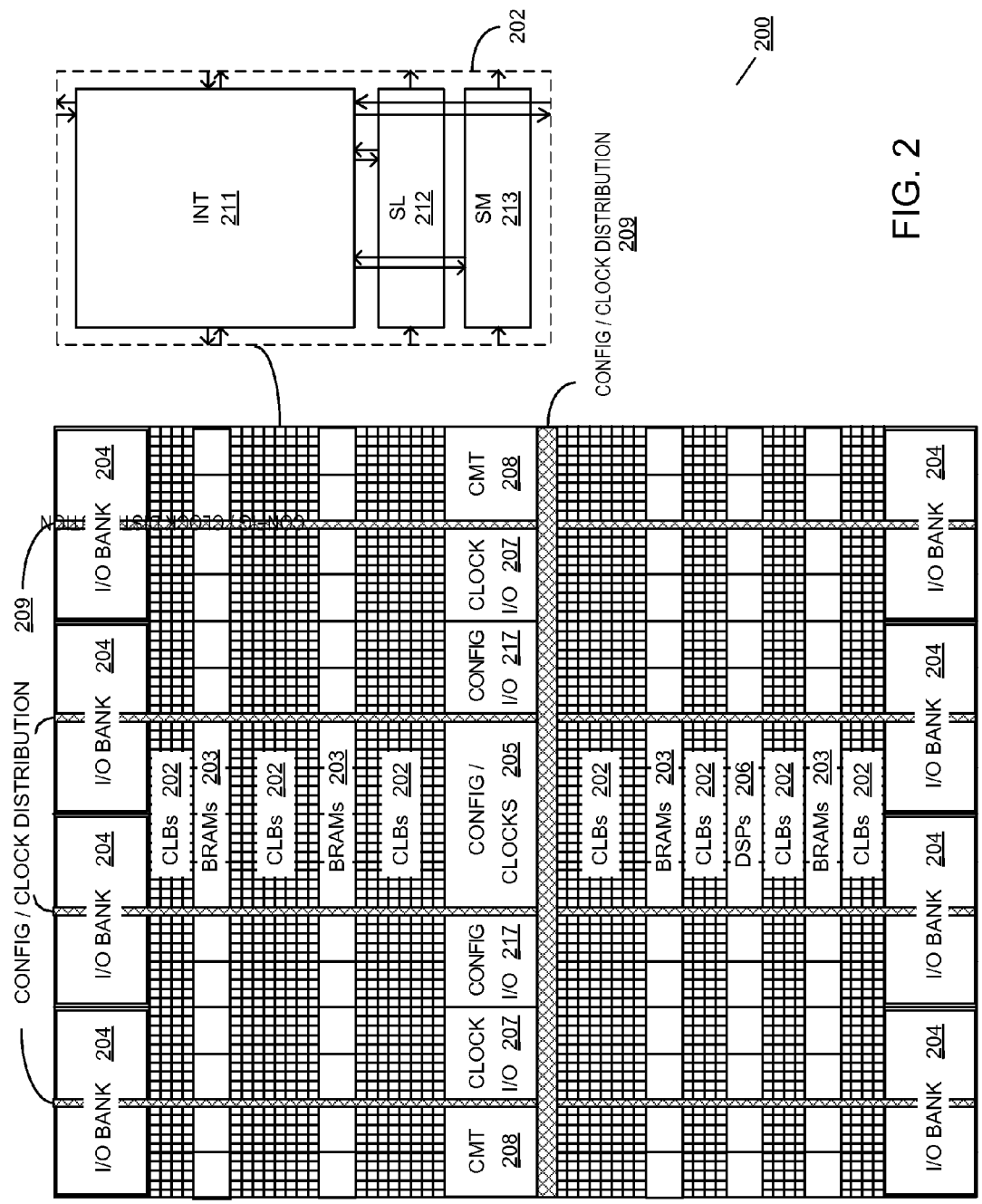
FIG. 2 is a block diagram illustrating another FPGA architecture that uses the same general architecture as the FPGA of FIG. 1, and that includes several different types of programmable logic blocks in accordance with another embodiment of the present invention.

FIG. 2 is a block diagram illustrating another FPGA architecture that uses the same general architecture as the FPGA of FIG. 1, and that includes several different types of programmable logic blocks in accordance with another embodiment of the present invention. The FPGA 200 of FIG. 2 includes CLBs 202, BRAMs 203, I/O blocks divided into "I/O Banks" 204 (each including 40 I/O pads and the accompanying logic), configuration and clocking circuitry 205, DSP blocks 206, clock I/O 207, clock management circuitry (CMT) 208, configuration I/O 217, and configuration and clock distribution areas 209.

In the FPGA 200 of FIG. 2, an exemplary CLB 202 includes a single programmable interconnect element (INT) 211 and two different "slices," slice L (SL) 212 and slice M (SM) 213. In some embodiments, the two slices are the same (e.g. two copies of slice L, or two copies of slice M). In other embodiments, the two slices have different capabilities. In some embodiments, some CLBs include two different slices and some CLBs include two similar slices. For example, in some embodiments some CLB columns include only CLBs with two different slices, while other CLB columns include only CLBs with two similar slices.

FIGS. 1 and 2 illustrate FPGA type programmable ICs by way of example to better illustrate one or more embodiments of the present invention. It should be appreciated, however, that one or more embodiments disclosed herein can be applied to other types of programmable ICs and that FPGAs are used for purposes of illustration without limitation.

Figure 3:
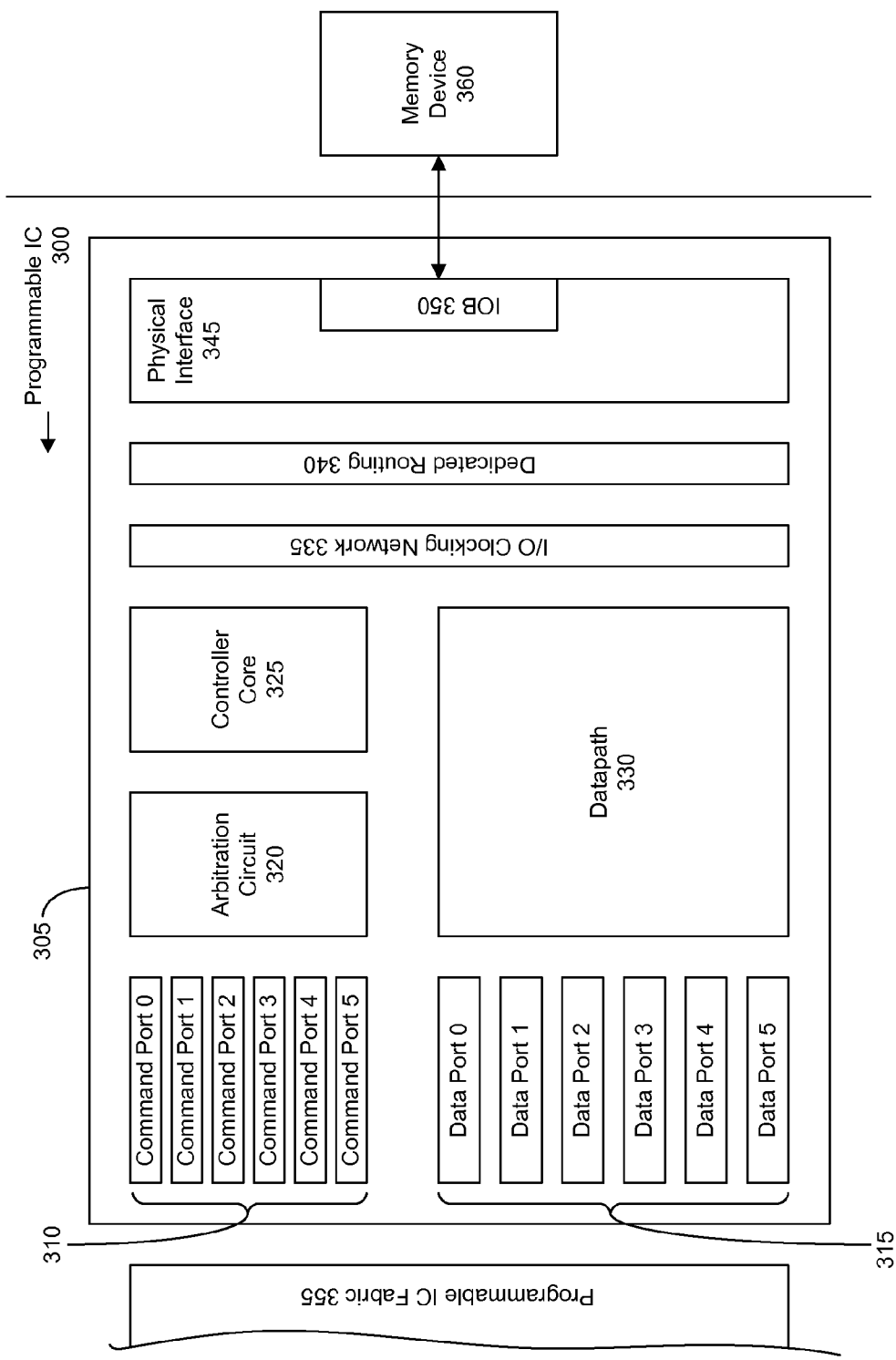
FIG. 3 is a block diagram illustrating a memory controller block disposed within a programmable integrated circuit device (IC) in accordance with another embodiment of the present invention.

FIG. 3 is a third block diagram illustrating a memory controller block 305 disposed within a programmable IC 300 in accordance with another embodiment of the present invention. Memory controller block 305 can be disposed within any of a variety of programmable ICs. For example, memory controller block 305 can be disposed within an FPGA having the architecture illustrated with respect to FIG. 1 or an FPGA having an architecture illustrated with respect to FIG. 2. The particular type of programmable IC within which memory controller block 305 is disposed is not intended to limit one or more embodiments disclosed herein.

As pictured, memory controller block 305 includes a plurality of command ports 310, a plurality of data ports 315, an arbitration circuit 320, and a controller core 325. Memory controller block 305 further can include a datapath 330, I/O clocking network 335, dedicated routing 340, and a physical interface 345 comprising at least one IOB 350. Memory controller block 305 also can include one or more counters and accompanying circuitry (not shown) as described with respect to the remaining figures within this specification.

Command ports 310 can be coupled to programmable IC fabric 355 to receive commands directed to memory controller block 305 relating to accessing memory device 360. Programmable IC fabric 355 represents the portion of programmable IC 300 that can be programmed, or otherwise configured, to implement user circuit designs or portions of user circuit designs. Data ports 315 also can be coupled to programmable IC fabric 355 to output data read from memory device 360 and to receive data to be written to memory device 360.

Arbitration circuit 320 can be configured to determine which one of command ports 310 currently has priority for accessing memory device 360. Arbitration circuit 320 obtains a command from the command port having priority and provides the command to controller core 325. Controller core 325 can convert commands received through command ports 310, e.g., the user interface, into the instructions and signal sequences necessary to communicate with memory device 360. As noted, memory device 360 is external to programmable IC 300, e.g., is "off-chip."

Datapath 330 comprises the circuitry necessary to process, or handle, the flow of data between memory device 360 and programmable IC fabric 355 through data ports 315. Physical interface 345 can be configured to convert instructions into the actual timing relationships and signaling necessary to communicate with memory device 360. Memory controller block 305 can utilize general I/O clocking network 335 to facilitate operation and communication with memory device 360. I/O clocking network 335, which is similar to the global clocking network of programmable IC 300, can operate at higher frequencies than the global clocking network. I/O clock network 335 can be used to clock I/Os of programmable IC 300 and memory controller block 305. Signals exchanged between physical interface 345 and core controller 325 and physical interface 345 and datapath 330 can be processed through dedicated routing 340 comprising dedicated wiring circuitry unavailable for use by user circuit designs, thereby facilitating efficient data exchange. The external interface between memory device 360 and physical interface 345 can be implemented using one or more IOBs 350, as described with reference to FIGS. 1 and 2.

Memory device 360 can be implemented as any of a variety of memory devices. For example, memory device 360 can be implemented in the form of a single data rate (SDR) type of device, a standard double data rate (DDR) type of device comprising a standard memory interface, a DDR2 type of device, a DDR3 type of device, or a low power DDR (LPDDR or mobile DDR) type of device. Though not shown, memory device 360 can include a memory control input configured to receive memory control signals, a data interface configured to receive data and output data, and an address input configured to receive a memory address that is the subject of each memory operation, e.g., command, passed to memory device 360.

In one embodiment, memory controller block 305 can be configured to implement a calibration process that can be performed at system startup to align the signals exchanged between memory device 360 and memory controller block 305. The calibration process performed requires normal operation of memory controller block 305 and memory device 360 to pause while the calibration process continues. During the calibration process, memory controller block 305 can align the clock signal DQ Strobe (DQS) used internal to programmable IC 300 relative to the various data signals (DQ) from memory device 360. The calibration process compensates for internal propagation delay within the clock network of the IC as well as jitter that may exist on the clock signal.

Subsequent to the initial calibration procedure, dynamic calibration procedures can be performed to maintain calibration in spite of variations in temperature and/or voltage within programmable IC 300. Variations in temperature and/or voltage can cause the amount of delay provided by a delay circuit to change over time despite no change being made to the setting of the delay circuit. Accordingly, to continue to apply the same delay to a signal in absolute terms, as determined during the initial startup calibration procedure, the setting of the delay circuit used to calibrate signals must be modified over time to accommodate for changes in temperature and/or programmable IC 300.

Figure 4:
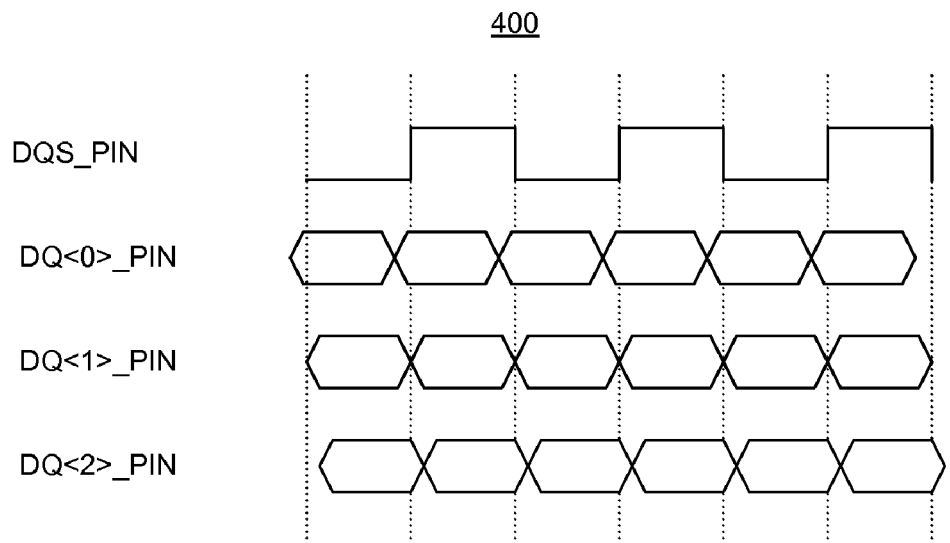
FIG. 4 is a signal diagram illustrating misaligned signals that can be received by a programmable IC from an external memory device.

FIG. 4 is a signal diagram illustrating misaligned signals that can be received by a programmable IC from an external memory device. Prior to operation of memory controller block 305 with the external memory device, e.g., memory device 360 of FIG. 3, the signals illustrated must be calibrated to ensure proper alignment. While the signals shown in FIG. 4 may leave memory device 360 edge aligned, the signals often are received at programmable IC 300 with skewed timing so that the edges are no longer aligned. FIG. 4 illustrates the state of signals as received at programmable IC 300. The misalignment can occur for a variety of different reasons including, for example, mismatched traces. The circuit board traces carrying the signals from memory device 360 to programmable IC 300 can be of varying lengths causing different ones of the signals to arrive at programmable IC 300 at different times. In consequence, any alignment that may have existed when the signals were output from memory device 360 is lost in transit to programmable IC 300.

As shown in FIG. 4, the DQ signals DQ<0>-DQ<2>, which refer to data signals as received at data pins of programmable IC 300, are neither edge aligned with one another nor edge aligned with DQS_PIN. DQS_PIN represents the uncalibrated clock, or strobe, signal received from memory device 360. While only a limited number of data signals are illustrated for purposes of discussion, it should be appreciated that additional data signals, e.g., DQ<0>-DQ<N>, where N is an integer value such as 15, for example, can be used depending upon the particular type of memory device 360 coupled to memory controller block 305 of programmable IC 300.

Figure 5:
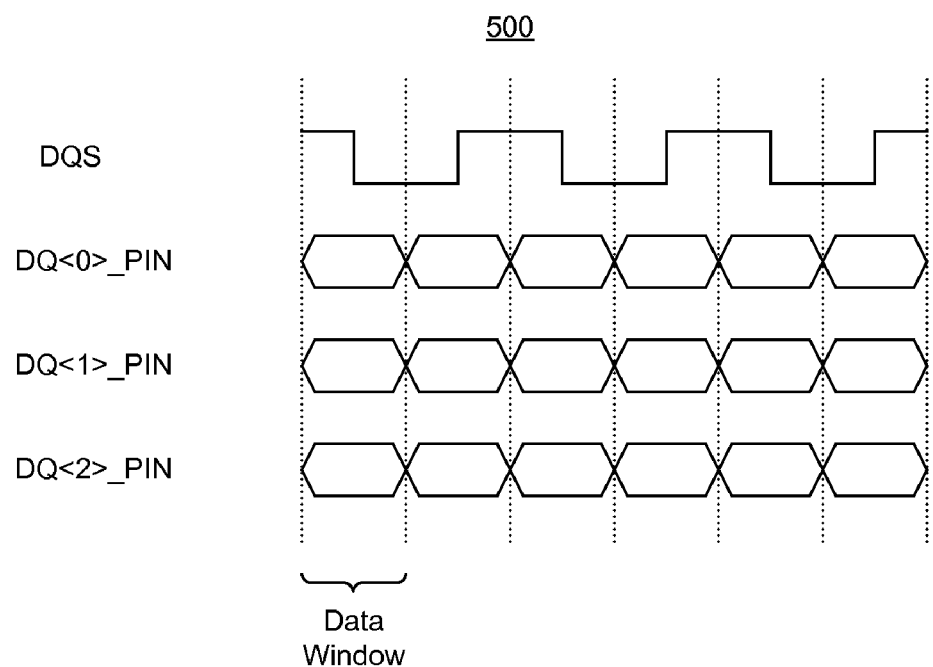
FIG. 5 is a signal diagram illustrating properly aligned signals.

FIG. 5 is a signal diagram illustrating properly aligned signals. DQS represents a processed, e.g., a calibrated version of, DQS_PIN within programmable IC 300 that is usable by memory controller block 305 for performing memory related functions. As shown, DQS has been shifted to occur at the center of the data window. More particularly, one can see that the positive and negative edges of DQS are centered between positive and negative edges of the DQ signals, e.g., at a midpoint of a logic high and/or logic low of the DQ signals. Further, the DQ signals are edge aligned.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each signal or wire may represent bi-directional communication between two, or more, components connected by the signal or wire as the case may be.

Figure 6:
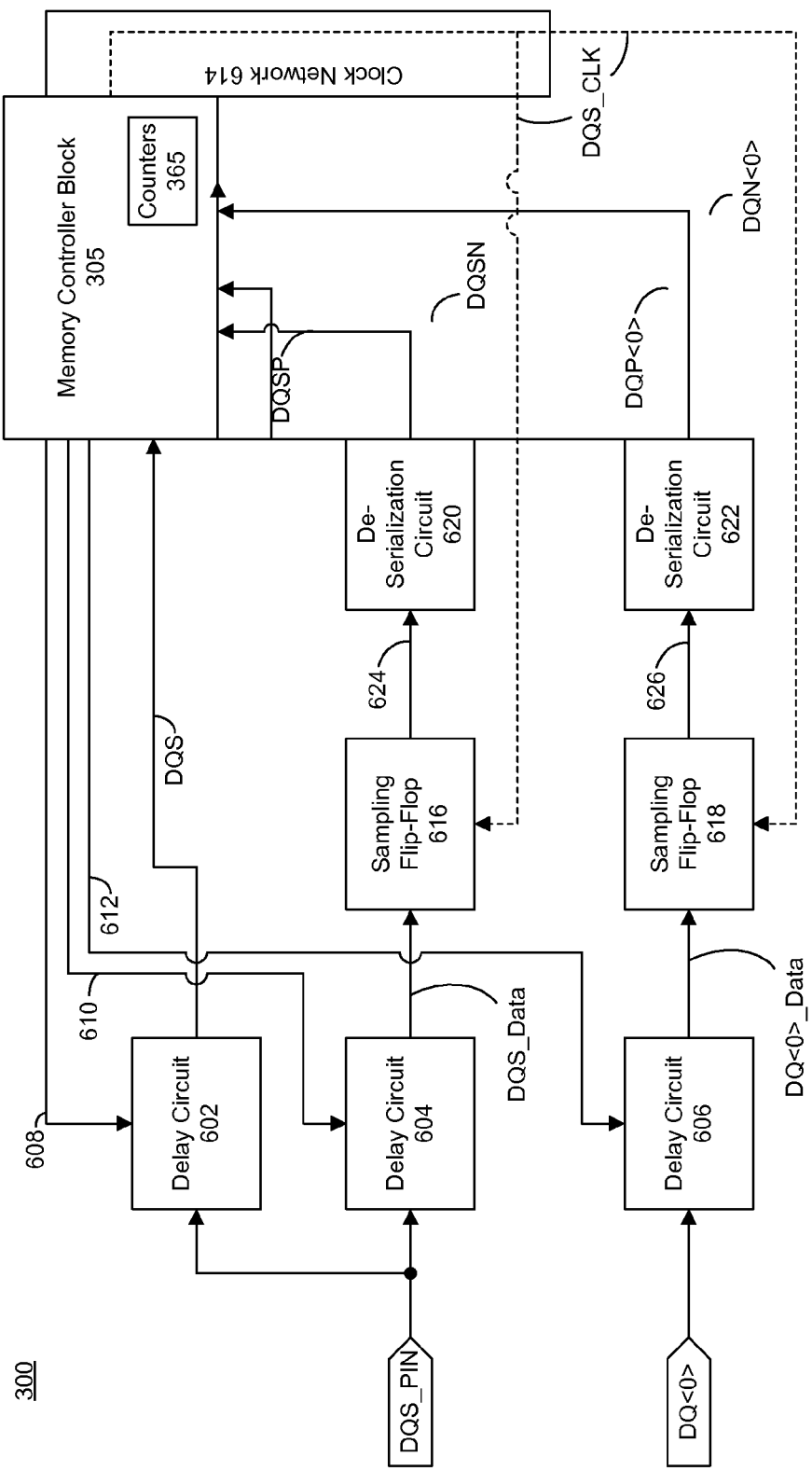
FIG. 6 is a block diagram illustrating a system including the memory controller block of FIG. 3 in accordance with another embodiment of the present invention.

FIG. 6 is a block diagram illustrating a system including memory controller block 305 of FIG. 3 in accordance with another embodiment of the present invention. FIG. 6 illustrates a simplified view of memory controller block 305 within programmable IC 300 for purposes of illustration. It should be appreciated that the various subsystems and components illustrated in FIG. 6 are not drawn to scale, but rather are pictured to facilitate a better understanding of selected aspects of one or more embodiments disclosed within this specification.

FIG. 6 illustrates a system that is configurable to perform DDR signal calibration, inclusive of duty cycle correction and clock jitter accommodation. As noted, prior to operation of memory controller block 305 with an external memory device, e.g., memory device 360 of FIG. 3, signals must be calibrated to ensure proper alignment among data and clock signals alike. FIG. 6 illustrates exemplary circuitry that can be used to perform the various signal processing functions described within this specification.

In one embodiment, controller core 325 (not shown), illustrated with reference to FIG. 3, can include, or implement, the decision-making circuitry, e.g., a state machine, processor, or the like, necessary to perform the various steps described within this specification. Memory controller block 305 also can include one or more counters 365 as shown. Counters 365, as will be described within this specification in greater detail, can be used to track one or more quantities such as delay size in terms of taps, the size of a jitter region, or clock cycles, for example. Counters 365 can be disposed within memory controller block 305 as shown. In another embodiment, counters 365 can be disposed within controller core 325.

FIG. 6 illustrates a plurality of delay circuits 602, 604, and 606. Each of delay circuits 602-606 can be configured to provide a variable, and dynamically adjustable, amount of delay to a signal applied to an input of the delay circuit. For example, each of delay circuits 602-606 can be implemented as a multi-tap delay line. In general, each of delay circuits 602-606 can, responsive to receiving an input signal, generate a delayed version of the input signal. The amount of delay applied is specified by a tap setting of the delay circuit that can be specified in the form of a number of taps that are to be applied to the input signal. Appreciably, a tap setting of zero applies no delay to the input signal and allows the input signal to pass through the delay circuit substantially unaltered.

The tap setting of each respective delay circuit 602-606 can be changed, or varied, over time dynamically. The tap setting of each of circuits 602-606 can be varied according to control signals 608, 610, and 612 respectively. As illustrated, memory controller block 305 generates control signals 608-612 to control and vary the amount of delay, e.g., via the tap setting, of each of delay circuits 602-606 according to varying conditions as will be described within this specification. Changing the tap setting of any of delay circuits 602-608 via control signals 608-612 changes the amount of delay applied to the input signal. Each tap provides a fixed and known amount of delay.

In one embodiment, each of delay circuits 602-606 can apply a first amount of delay to positive (rising) edges of an input signal and a second amount of delay, that is independent of the first amount of delay, to the negative (falling) edges of the input signal. The ability to independently vary the delay applied to positive and negative edges of signals input to delay circuits 602-606, with each independent amount of delay being controllable via control signals 608-612, allows memory controller block 305 to not only delay signals for purposes of alignment, but also to modify and/or correct duty cycle distortion present in signals received by each of delay circuits 602-606 to achieve approximately a 50-50 duty cycle.

Each of delay circuits 602-606 also can be configured to determine the number of taps that approximate a selected time span. For example, the time span can be one-half of a clock period, referred to herein as a bitperiod. In general, a ring oscillator, or other reliable clock signal source such as a phase locked loop (PLL), can be configured to operate at a high frequency that has a predetermined or known relationship to the delay of one tap of the delay circuits 602-606. Thus, a particular number of oscillations, e.g., a plurality of oscillations, of the ring oscillator approximates the delay of one tap of the delay circuit.

A counter can count the number of oscillations occurring over the selected time span, e.g., a bitperiod, as determined through edge detection or the like on the input signal to the delay circuit. Since the frequency of the ring oscillator is known, as is the relationship of the frequency of the ring oscillator to the amount of delay provided by a tap, a value can be determined that specifies the number of taps of a delay circuit needed to approximate the selected time span of the incoming signal. For purposes of illustration, the number of taps determined to approximate a bitperiod of the input signal can be referred to as the "maximum tap value" or "MTS." In this manner, the frequency of the incoming signal to each of delay circuits 602-606 also can be determined.

In one embodiment, the circuitry required to determine the number of taps per bitperiod and/or the frequency of an incoming signal, e.g., the ring oscillator and counter, can be disposed within each respective delay circuit 602-606. In another embodiment, one or more components can be located external to each delay circuit 602-606. For example, the source of the clock signal, e.g., the ring oscillator or PLL, can be external to each of delay circuits 602-606 and provide a reference signal to each of delay circuits 602-606.

One example of a delay circuit that can be used within one or more embodiments disclosed within this specification is the Delay primitive within various programmable ICs available from Xilinx, Inc. of San Jose, Calif. In some implementations, the Delay primitive can provide up to 256 taps of delay. Thus, the delay provided by an Delay primitive can be specified in terms of a number of taps ranging from 1 to 256. As noted, each Delay can have a first tap setting specifying a delay to be applied to the positive edge of an input signal and a second, and independent, tap setting specifying a delay to be applied to a negative edge of the input signal. Each increase of one in the tap setting for a selected edge increases the delay provided by the Delay primitive to the selected edge of the incoming signal by a predetermined amount of time. Each decrease of one in the tap setting for a selected edge decreases the delay provided by the Delay primitive to the selected edge of the incoming signal by a predetermined amount of time.

The clock signal DQ Strobe, illustrated as DQS_PIN, can be received from memory device 360 via an IOB of programmable IC 300. As shown, DQS_PIN is provided to each of delay circuits 602 and 604. Delay circuit 602 processes DQS_PIN to generate DQS, which is provided to an input port of memory controller block 305. As illustrated, DQS is propagated through memory controller block 305 from an output port to clock network 614 of programmable IC 300, where DQS becomes DQS_CLK. DQS_CLK is provided to each of sampling flip-flops (FFs) 616 and 618 as a clock signal illustrated in FIG. 6 using dashed lines.

Though sampling FFs 616 and 618 are illustrated as a single block, it should be appreciated that each of sampling FFs 616 and 618 can include a plurality of FFs. More particularly, each of sampling FFs 616 and 618 can be configured to include a first FF clocked using the true clock signal, e.g., DQS_CLK, and a second FF clocked using an inverted version of DQS_CKL. Thus, the first FF within each of sampling FFs 616 and 618 can sample the value of the input signal on the positive edge of DQS_CLK. The second FF within each of sampling FFs 616 and 618 can sample the value of the input signal on the negative edge of DQS_CLK. Sampling FF 616 can output serial signal 624 indicating the values sampled from DQS_Data on the positive and negative edges of DQS_CLK. As illustrated, sampling FF 616 outputs signal 624 to de-serialization circuit 620. Sampling FF 618 can output serial signal 626 indicating the values sampled from DQ<0>_Data on the positive and negative edges of DQS_CLK. Sampling FF 618 outputs signal 626 to de-serialization circuit 622.

As noted, DQS_PIN also is processed by delay circuit 604. Delay circuit 604, responsive to receiving DQS_PIN, generates DQS_Data. DQS_Data is output from delay circuit 604 to sampling FF 616. Sampling FF 616 samples DQS_Data on positive and negative edges of DQS_CLK and outputs sampled signal 624 to de-serialization circuit 620. De-serialization circuit 620 receives sampled signal 624 and outputs signals DQSP and DQSN to memory controller block 305. DQSP indicates the value DQS_Data on the positive edges of DQS_CLK over time, e.g., as either a logic high (1) or a logic low (0). DQSN conveys the value of DQS_Data on negative edges of DQS_CLK over time.

A data signal, illustrated as DQ<0>, can be received from the external memory device through an IOB of programmable IC 300. For purposes of illustration, only one data signal (DQ<0>) is illustrated. It should be appreciated that a plurality of data signals, e.g., DQ<0>-DQ<N>, can be processed through the same or similar circuitry, using the same techniques as described with reference to the processing of DQ<0>. Within this specification, a data signal from memory device 360 can be referred to as DQ or DQ<N>, while a plurality of such signals can be collectively referred to as DQs, DQ signals, or DQ<0>-DQ<N>.

DQ<0> is provided to, and processed by, delay circuit 606. Delay circuit 606, responsive to receiving DQ<0>, generates DQ<0>_Data. DQ<0>_Data is output from delay circuit 606 to sampling FF 618. Sampling FF 618 samples DQ<0>_Data on positive and negative edges of DQS_CLK and outputs sampled signal 626 to de-serialization circuit 622. De-serialization circuit 622 receives sampled signal 626 and outputs signals DQP<0> and DQN<0> to memory controller block 305. DQP<0> specifies the value of DQ<0>_Data on the positive edge of DQS_CLK over time. DQN<0> specifies the value of DQ<0>_Data on the negative edge of DQS_CLK over time.

In operation, the system illustrated in FIG. 6 can begin in a state where programmable IC 300 has been powered on and the signals exchanged between memory device 360 and programmable IC 300 require calibration. In one embodiment, subsequent to powering on programmable IC 300, memory controller block 305 can initiate a continuous read operation from memory device 360 to obtain test signals, e.g., DQS_PIN and DQ<0>-DQ<N>, from memory device 360 that can be used for performing calibration as described within this specification.

In general, memory controller block 305 can perform several steps to calibrate signals. In one aspect, DQS is to be delayed to transition in the center of the data window, e.g., in the center of a logic high and in the center of a logic low of the DQ signals presuming a 50-50 duty cycle in the DQ signals and in DQS as illustrated in FIG. 5. To determine the amount by which DQS must be delayed to be placed in the center of the data window, memory controller block 305 must determine several items of information such as type of duty cycle distortion present on DQS, the internal delay of clock network 614, and the like.

Operation of the system illustrated in FIG. 6 is described in greater detail with reference to the following signal diagrams. Like numbers will be used to refer to the same items throughout this specification. For purposes of illustration within the signal diagrams, each bitperiod typically is divided into ten segments, or taps. It should be appreciated that greater resolution in terms of the number of taps per bitperiod can be used and that the use of ten taps per bitperiod is solely to facilitate discussion of one or more embodiments disclosed within this specification without limitation.

FIGS. 7A-7D are signal diagrams that, taken collectively, illustrate a method of identifying a type of duty cycle distortion present on a signal in accordance with another embodiment of the present invention. Prior to restoring duty cycle on a selected signal to 50-50, the type of duty cycle distortion present on the selected signal first must be identified. In general, a signal such as DQS can suffer from one of two different types of duty cycle distortion. The first type of duty cycle distortion is when DQS_PIN has a short "1" period. A short 1 period means that the logic high of DQS_PIN remains high for a smaller amount of time than the logic low remains low. The second type of duty cycle distortion is when DQS_PIN has a short "0" period. A short 0 period means that the logic low of DQS_PIN remains low for a smaller amount of time than the logic high remains high.

Initially, memory controller block 305 can set delay circuits 602 and 604 to provide zero delay. Accordingly, DQS_PIN propagates through delay circuit 602 and is output as DQS to memory controller block 305. As noted, DQS can propagate through memory controller block 305 to feed clock network 614 as DQS_CLK. With delay circuit 602 set to provide zero delay, DQS_CLK is delayed with respect to DQS_PIN only by the propagation delay inherent to programmable IC 300 through the path described. At least initially, DQS_CLK can be thought of, for example, as a delayed version of DQS_PIN, where the delay generally corresponds to the internal delay of clock network 614. Thus, sampling FF 616 is effectively clocked by a delayed version of the signal provided as an input signal to be sampled. With sampling FF 616 clocked as described and receiving DQS_Data as input, it can be seen from FIG. 7A that sampling FF 616 is guaranteed, when delay circuits 602 and 604 apply no delay, to sample a logic high from DQS_Data on the positive edge of DQS_CLK and a logic low from DQS_Data on the negative edge of DQS_CLK.

Figure 7A:
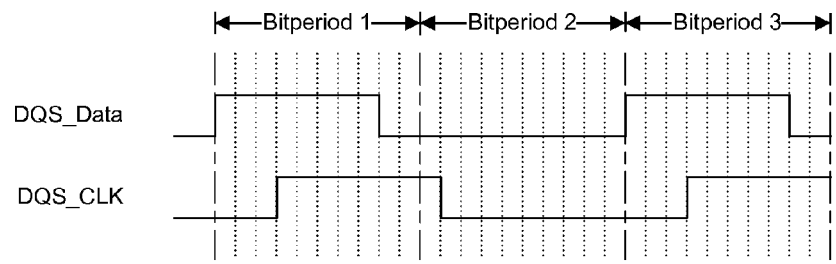
FIGS. 7A-7D are signal diagrams that, taken collectively, illustrate a method of identifying a type of duty cycle distortion present on a signal in accordance with another embodiment of the present invention.
Figure 7B:
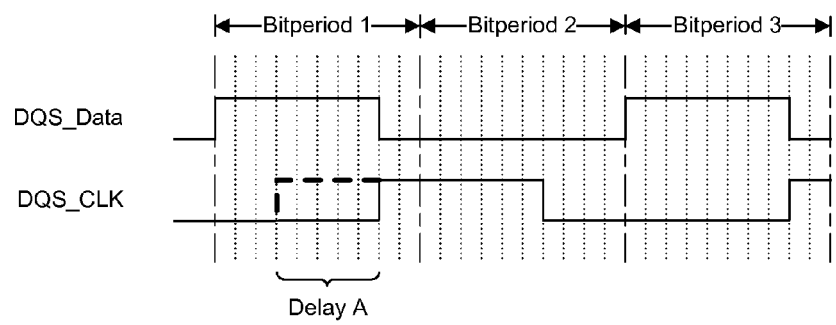

FIG. 7A illustrates the state of DQS_Data and DQS_CLK with each of delay circuits 602 and 604 set, via memory controller block 305, to provide zero delay. The delay present within DQS_CLK illustrates the internal delay of clock network 614 within programmable IC 300. Memory controller block 305 can begin to increase the delay applied by delay circuit 602, one tap at a time, until sampling FF 616 captures a logic low from DQS_Data on the positive edge of DQS_CLK. The delay applied by delay circuit 602 can be referred to as delay A. FIG. 7B illustrates the state of DQS_Data and DQS_CLK when sampling FF 616 captures a logic low on the positive edge of DQS_CLK.

Figure 7C:
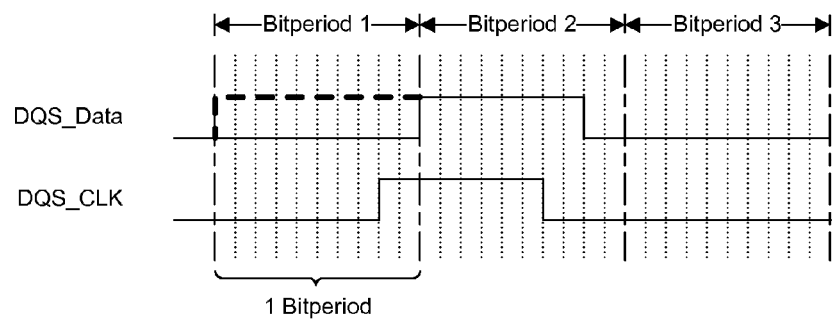
Figure 7D:
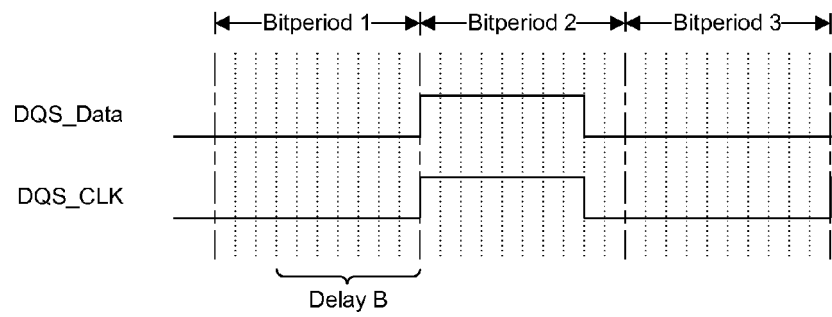

Next, memory controller block 305 can instruct delay circuit 604 to delay DQS_Data by a full bitperiod, as illustrated in FIG. 7C. Memory controller block 305 then continues to increase the delay applied to DQS_CKL, one tap at a time through delay circuit 602. DQS_CLK is delayed until sampling FF 616 captures a logic high from DQS_Data on the positive edge of DQS_CLK. The second amount of delay applied, e.g., the amount of delay now applied to DQS_CLK in total, can be referred to as delay B, as illustrated in FIG. 7D.

Memory controller block 305 identifies DQS_PIN as having short 1 period type of duty cycle distortion when delay B is greater than delay A. Correspondingly, memory controller block 305 identifies DQS_PIN as having short 0 period type of duty cycle distortion when delay A is greater than delay B. Having identified the type of duty cycle distortion present on DQS_PIN, memory controller block 305 can implement an appropriate calibration procedure to generate DQS by delaying DQS_PIN by a bitperiod as previously described while correcting for duty cycle distortion and accounting for internal delay of clock network 614.

FIGS. 8A-8E are signal diagrams that, taken collectively, illustrate a method of calibrating a signal in accordance with another embodiment of the present invention. More particularly, FIGS. 8A-8E illustrate a method of calibrating DQS in a manner that can account for internal delay of clock network 614 within programmable IC 300 and also correct for short 1 period type of duty cycle distortion thereby restoring a 50-50 duty cycle to DQS and DQS_CLK. The procedure illustrated in FIGS. 8A-8E can be selected and implemented responsive to determining that DQS_PIN has short 1 period type of duty cycle distortion.

Initially, memory controller block 305 can set delay circuits 602 and 604 to provide zero delay. As noted, with delay circuits 602 and 604 set in this manner, sampling FF 616 is effectively clocked by a delayed version of the signal provided as the input signal to be sampled. With sampling FF 616 clocked as described and receiving DQS_Data as input, sampling FF 616 is guaranteed to sample a logic high from DQS_Data on the positive edge of DQS_CLK and a logic low from DQS_Data on the negative edge of DQS_CLK.

Memory controller block 305 can be configured to begin incrementing the tap setting of delay circuit 604, one tap at a time, until the value(s) sampled by sampling FF 616 transition or change state. More particularly, memory controller block 305 can begin to increment the delay applied to both the positive edge and the negative edge of DQS_Data until sampling FF 616 samples a logic low from DQS_Data on the positive edge of DQS_CLK and/or a logic high from DQS_Data on the negative edge of DQS_CLK.

Figure 8A:
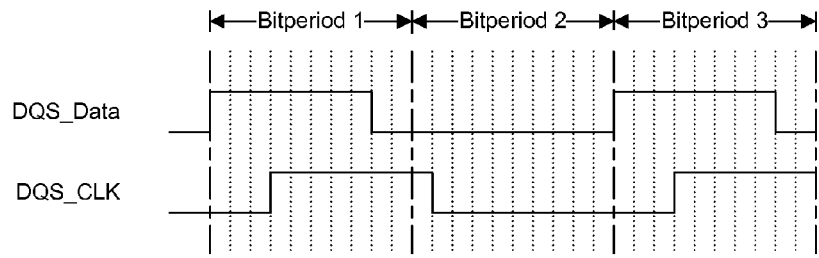
FIGS. 8A-8E are signal diagrams that, taken collectively, illustrate a method of calibrating a signal in accordance with another embodiment of the present invention.
Figure 8B:
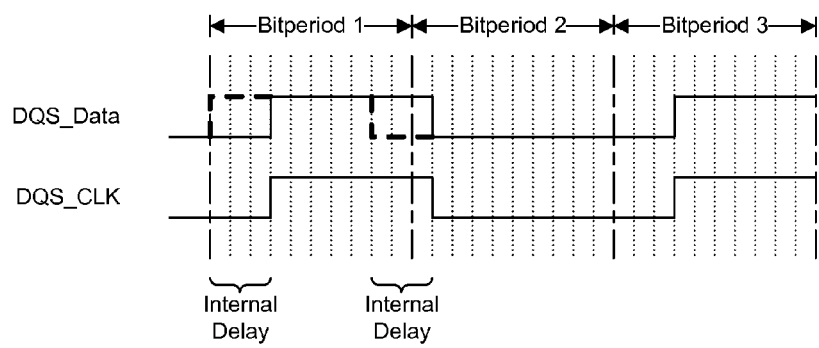

It should be appreciated that since sampling FF 616 is clocked by what is effectively a delayed version of the signal provided to sampling FF 616 as input, e.g., DQS_Data, the transition of the values from high to low and from low to high sampled on the positive and negative edges of DQS_CLK respectively should occur at or about the same time, e.g., with the same number of taps being applied to the positive edge of DQS_Data as are applied to the negative edge of DQS_Data. FIG. 8B illustrates the state of DQS_Data and DQS_CLK when sampling FF 616 samples a logic low from DQS_Data on the positive edge of DQS_CLK and/or a logic high from DQS_Data on the negative edge of DQS_CLK. The dashed lines within DQS_Data in FIG. 8B illustrate the change from the state of DQS_Data shown in FIG. 8A.

The number of taps needed to achieve the transition in sampled values as indicated by DQSP and DQSN specifies the internal delay clock network 614 of programmable IC 300. Thus, the amount of delay needed to shift DQS to the center of the data window is a delay value that can be reduced by the internal delay of clock network 614 just measured. The internal delay, which is three taps in this example, serves to reduce the delay that must be added to move DQS to the center of the data window. In general, because both DQS and DQ signals require calibration, DQS_PIN can be delayed by a full bitperiod. DQ signals, post alignment with DQS, can be delayed one half of a bitperiod.

Recalling that each of delay circuits 602-608 can determine the frequency of the signal input to that delay circuit, determine the number of taps in a bitperiod of that signal (maximum tap value), and determine the resolution of a tap, it should be appreciated that in order to delay DQS by a bitperiod, DQS must be delayed by the maximum tap value minus the internal delay of clock network 614 of programmable IC 300 shown in FIG. 8B. For purposes of illustration, consider the case where the maximum tap value (bitperiod) is ten taps and the internal delay is determined to be three taps as noted in FIG. 8B. In this example, DQS_PIN can be delayed by seven taps, e.g., 10–3, to achieve a delay of a full bitperiod that accounts for the internal delay of clock network 614.

To achieve this, memory controller block 305 resets delay circuit 604 to again apply zero delay, resulting in an undelayed DQS_Data. Appreciably, when no delay is applied by delay circuit 604, DQS_PIN is effectively equivalent to DQS_Data. Memory controller block 305 next can load the tap setting determined by subtracting the internal delay from maximum tap value into delay circuit 602. This results in DQS_CLK being delayed by a full bitperiod as compared to DQS_PIN as illustrated in FIG. 8C.

Figure 8C:
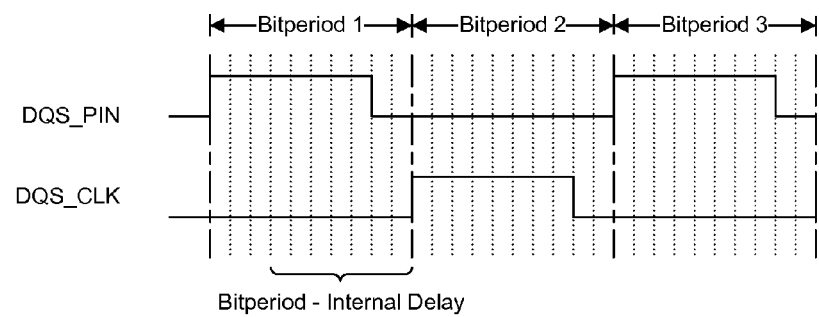

FIG. 8C illustrates that while the positive edge of DQS_CLK is aligned at the bitperiod boundary, the negative edge occurs prior to the bitperiod boundary, thereby exhibiting the short 1 period type of duty cycle distortion. Having delayed DQS by a bitperiod via delay circuit 602 and returned the tap settings of delay circuit 604 to zero, memory controller block 305 can begin increasing the delay applied to the negative edge of DQS_Data via delay circuit 604.

Figure 8D:
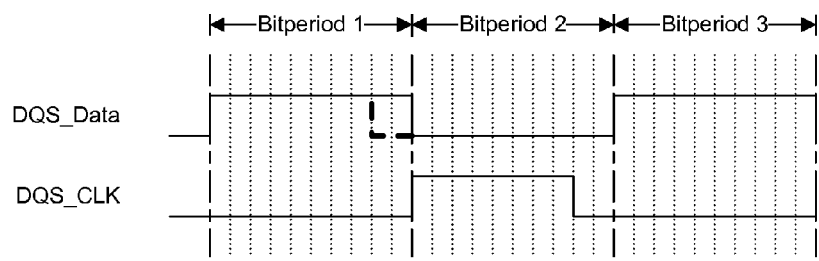

Memory controller block 305 can continue to increase the delay applied to the negative edge of DQS_Data, one tap at a time, until sampling FF 616 captures a logic high from DQS_Data on the positive edge of DQS_CLK. Thus, sampling FF 616 transitions from capturing a logic low to a logic high on the positive edge of DQS_CLK as indicated by DQSP. When DQSP indicates that sampling FF 616 has captured a logic high, the tap setting for the positive edge of DQS_Data can be determined. FIG. 8D illustrates the case in which sampling FF 616 transitions from capturing a logic low to a logic high on the positive edge of DQS_CLK. FIG. 8D illustrates that two taps of delay are required to delay the negative edge of DQS_Data to achieve a 50-50 duty cycle. The dashed line in FIG. 8D illustrates the state of DQS_Data from FIG. 8C prior to adding two taps of delay onto the negative edge.

Figure 8E:
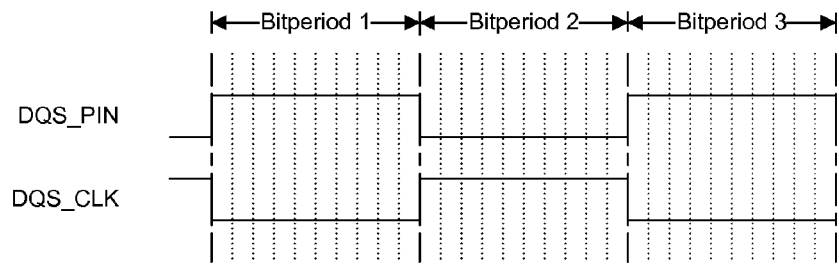

Accordingly, the delay illustrated in FIG. 8D, e.g., two taps, can be applied to the negative edge of DQS_CLK to achieve the desired 50-50 duty cycle. Thus, memory controller block 305 can instruct delay circuit 602 to increase the tap setting applied to the negative edge of DQS_PIN by the number of taps of the tap setting determined in delay circuit 604 from FIG. 8D. This results in the duty cycle of DQS being corrected to a 50-50 state. FIG. 8E illustrates the resulting state of DQS_PIN and DQS_CLK once processed as described.

FIGS. 9A-9E are signal diagrams that, taken collectively, illustrate a method of calibrating a signal in accordance with another embodiment of the present invention. More particularly, FIGS. 9A-9E illustrate a method of calibrating DQS in a manner that can account for inherent delay within programmable IC 300 and also correct for short 0 period type of duty cycle distortion thereby restoring a 50-50 duty cycle. The procedure illustrated in FIGS. 9A-9E can be selected and implemented responsive to determining that DQS_PIN has short 0 period type of duty cycle distortion.

Initially, memory controller block 305 can set delay circuits 602 and 604 to provide zero delay. Accordingly, DQS_PIN propagates through delay circuit 602 and is output as DQS to memory controller block 305. As noted, DQS can propagate through memory controller block 305 to feed clock network 614 as DQS_CLK. With delay circuit 602 set to provide zero delay, DQS_CLK is delayed with respect to DQS_PIN only by the propagation delay of clock network 614 of programmable IC 300 through the path described.

Figure 9A:
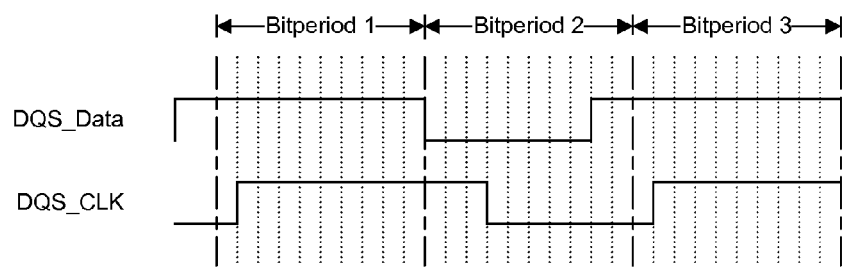
FIGS. 9A-9E are signal diagrams that, taken collectively, illustrate a method of calibrating a signal in accordance with another embodiment of the present invention.

With sampling FF 616 clocked as described and receiving DQS_Data as input, it can be seen from FIG. 9A that sampling FF 616 is guaranteed, when delay circuit 604 applies no delay, to sample a logic high from DQS_Data on the positive edge of DQS_CLK and a logic low from DQS_Data on the negative edge of DQS_CLK. Memory controller block 305 can be configured to begin incrementing the tap setting of delay circuit 604, one tap at a time, until the value(s) sampled by sampling FF 616 transition or change state. More particularly, memory controller block 305 can begin to increment the delay applied to both the positive edge and the negative edge of DQS_Data until sampling FF 616 samples a logic low from DQS_Data on the positive edge of DQS_CLK and/or a logic high from DQS_Data on the negative edge of DQS_CLK.

Figure 9B:
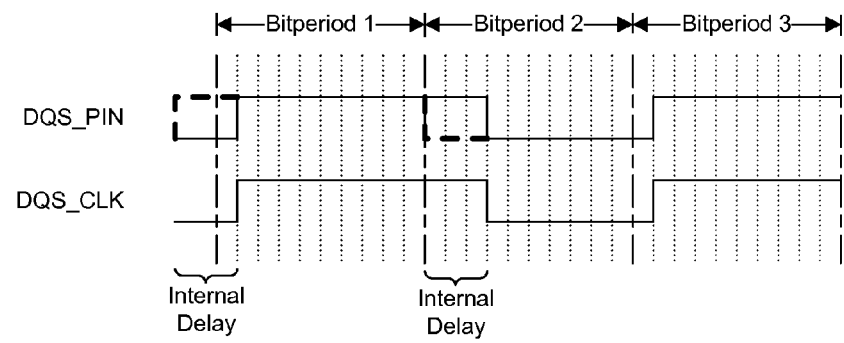

FIG. 9B illustrates the state of DQS_PIN and DQS_CLK when sampling FF 616 samples a logic low from DQS_Data on the positive edge of DQS_CLK and/or a logic high from DQS_Data on the negative edge of DQS_CLK. The dashed lines within DQS_Data in FIG. 9B illustrate the state of DQS_Data from FIG. 9A.

The number of taps needed to achieve the transition in sampled values as indicated by DQSP and DQSN specifies the internal delay of clock network 614. Thus, the amount of delay needed to shift DQS to the center of the data window is a delay value reduced by the internal delay just measured. The internal delay, which is again three taps in this example, serves to reduce the delay that must be added to shift DQS to the center of the data window. In general, because both DQS and DQ signals require calibration, DQS_PIN can be delayed by a full bitperiod. DQ signals, post alignment with DQS, can be delayed one half of a bitperiod. As noted, to delay DQS by a bitperiod, DQS must be delayed by the maximum tap value minus the internal delay of clock network 614 of programmable IC 300. In this example, DQS_CLK can be delayed by seven taps, e.g., 10–3, to achieve a delay of a full bitperiod that accounts for the internal delay of programmable IC 300.

To achieve this, memory controller block 305 resets delay circuit 604 to again apply zero delay, resulting in an un-delayed DQS_Data. Appreciably, when no delay is applied to DQS_PIN, DQS_Data is effectively equivalent to DQS_PIN. Memory controller block 305 next can load the tap setting, determined by subtracting the internal delay from the maximum tap value, into delay circuit 602. This results in DQS_CLK being delayed by a full bitperiod as compared to DQS_PIN as illustrated in FIG. 9C.

Figure 9C:
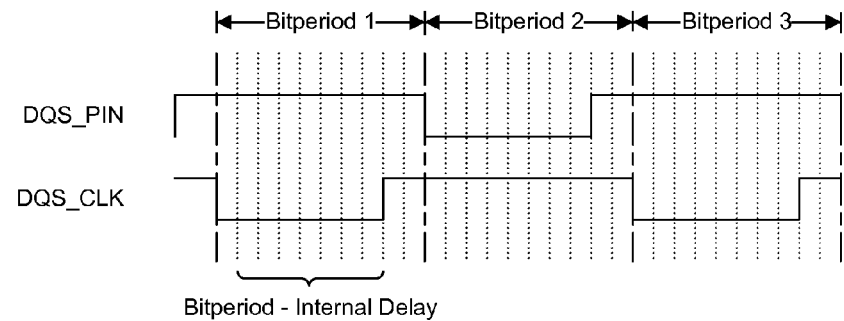

FIG. 9C also illustrates that while the negative edge of DQS_CLK is aligned with the bitperiod boundary, the positive edge occurs prior to the bitperiod boundary, thereby exhibiting the short 0 period type of duty cycle distortion. Having delayed DQS by a bitperiod from DQS_PIN and returned the tap settings of delay circuit 604 to zero, memory controller block 305 can begin delaying the positive edge of DQS_Data via delay circuit 604.

Figure 9D:
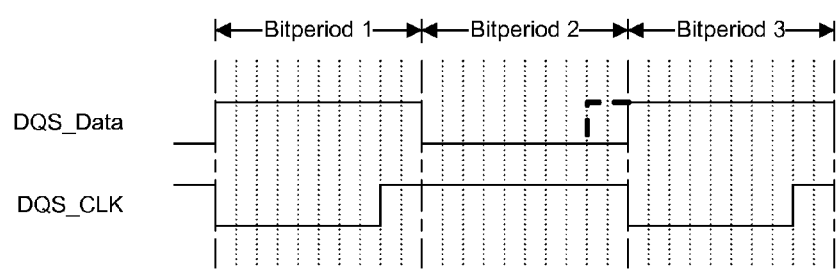

Memory controller block 305 can continue to increase the delay applied to the positive edge of DQS_Data, one tap at a time, until sampling FF 616 captures a logic high on the negative edge of DQS_CLK. Thus, sampling FF 616 transitions from capturing a logic low to a logic high on the negative edge of DQS_CLK as indicated by DQSN. When DQSN indicates that sampling FF 616 has captured a logic high, the tap setting for the negative edge of DQS_Data can be determined. FIG. 9D illustrates the situation in which sampling FF 616 transitions from capturing a logic low to a logic high on the negative edge of DQS_CLK. FIG. 9D illustrates that two taps of delay are required to delay the positive edge of DQS_Data to achieve a 50-50 duty cycle. The dashed line in FIG. 9D illustrates the state of DQS_Data from FIG. 9C, prior to adding two taps of delay onto the positive edge.

Figure 9E:
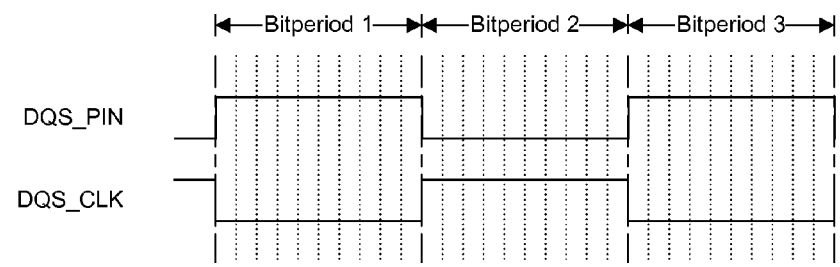

Accordingly, the delay illustrated in FIG. 9D, e.g., two taps, can be applied to the positive edge of DQS_CLK to achieve the desired 50-50 duty cycle. Thus, memory controller block 305 can instruct delay circuit 602 to increase the tap setting applied to the positive edge of DQS_PIN by the number of taps of the tap setting determined in delay circuit 604. This results in the duty cycle of DQS being corrected to a 50-50 state. FIG. 9E illustrates the resulting state of DQS_PIN and DQS_CLK once processed as described.

Figure 10:
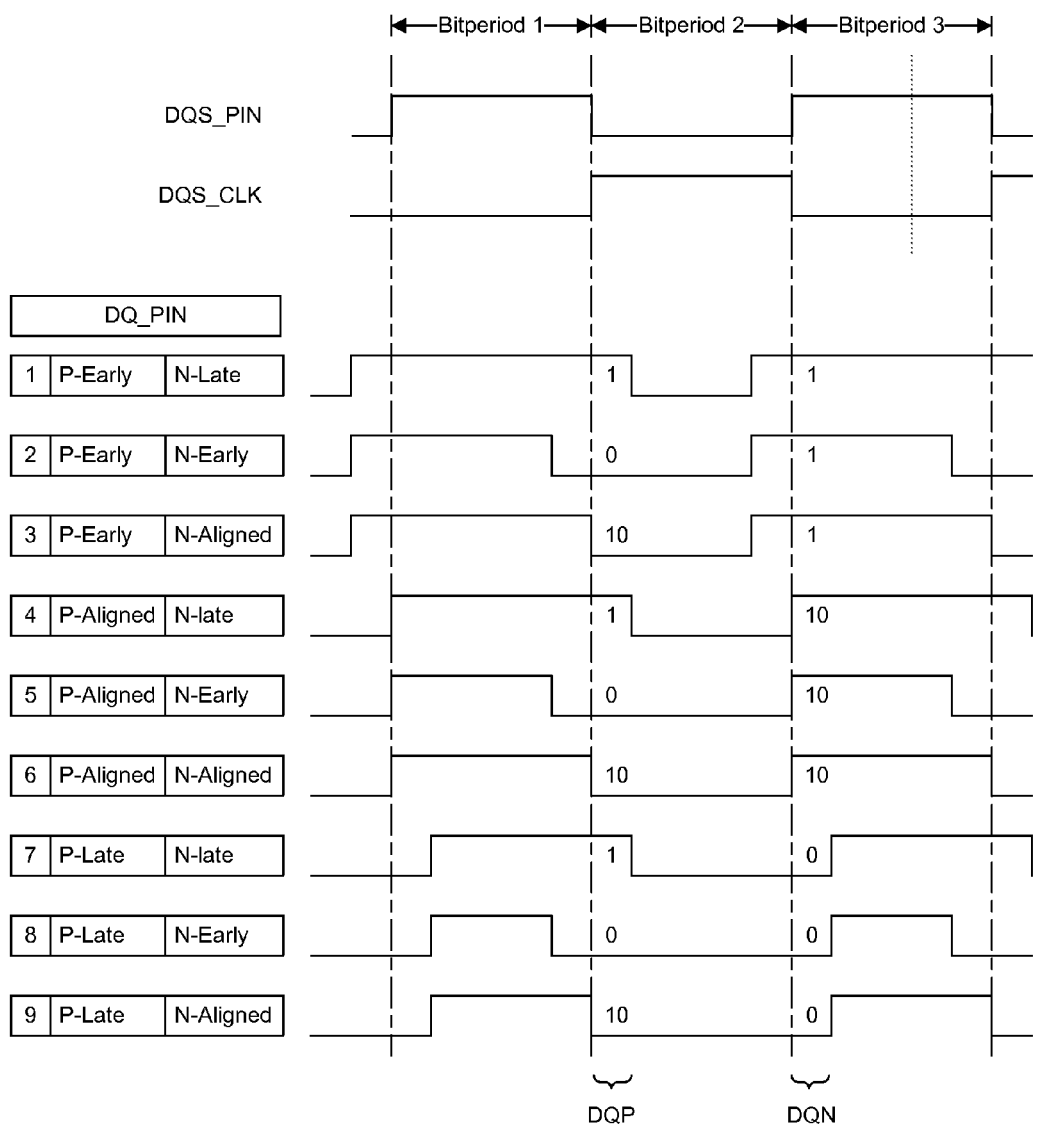
FIG. 10 is a signal diagram illustrating a method of determining a classification of a signal for purposes of calibration in accordance with another embodiment of the present invention.

FIG. 10 is another signal diagram illustrating a method of determining a classification of a signal for purposes of calibration in accordance with another embodiment of the present invention. More particularly, FIG. 10 illustrates a technique for classifying DQ signals. FIG. 10 illustrates nine different classifications of DQ signals that can be received via the DQ_PIN of programmable IC 300. For each classification of DQ signal, the positive edge can be early, aligned, or late as compared to DQS_CLK. Similarly, for each type of DQ signal, the negative edge can be early, aligned, or late as compared to DQS_CLK, resulting in the nine different possible classifications shown. As noted, DQ signals received directly from DQ_PIN can be processed to become edge aligned and delayed by one half of a bitperiod, e.g., one fourth of a clock cycle of DQS corresponding to the delay quantity "maximum tap setting/2," so that, once calibrated, edges of DQS_CLK occur or transition at the midpoint, e.g., the center, of the logic high or low, as the case may be, of each respective DQ signal. Similarly, the edges of the DQ signals occur at the midpoints, e.g., centers, of the logic highs or lows of DQS, once calibrated.

In order to align each DQ signal, that signal first must be characterized in terms of a classification. The rising edge of DQS_CLK at the boundary between bitperiod 1 and bitperiod 2 shows the value captured by sampling FF 618 for each different type of DQ signal as reflected by DQP. Similarly, the falling edge of DQS_CLK at the boundary between bitperiod 2 and bitperiod 3 shows the value captured by sampling FF 618 for each different type of DQ signal as reflected by DQN.

Values for DQN and DQP can be checked over a plurality of cycles of DQS_CLK. For example, over 16 different samples can be collected for each DQN and DQP for each DQ<N>. The values captured for DQP and DQN indicate the classification of the DQ signal. It should be appreciated that the value "10" in FIG. 10 (e.g., DQP for classifications 3, 6, and 9 and DQN for classifications 4, 5, and 6) indicates that over the plurality of clock cycles that a given DQ signal is sampled, both values of one and zero are detected for DQP, DQN, or both DQP and DQN as the case may be.

Taking DQ signal of classification 1 (Positive edge (P) Early, Negative edge (N) Late), one can see that the signal is characterized by observing DQP=1 and DQN=1 over each clock cycle that DQP and DQN are evaluated. A DQ signal of classification 1 can be edge aligned by delaying the positive edge of DQ until the positive edge is aligned with the positive edge of DQS_CLK. This condition is identifiable when the output of sampling FF 618 changes state. In this case, DQ begins high at the positive edge of DQS_CLK. Memory controller block 305 can increase the delay applied by delay circuit 606 to the positive edge of the DQ signal until DQP indicates a logic low. Similarly, memory controller block 305 can increase the delay applied to the negative edge of the DQ signal by delay circuit 606 until the DQ signal is edge aligned with the negative edge of DQ_CLK. A similar procedure can be performed for the remaining classification 2-9 of DQ signals shown.

Figure 11A:
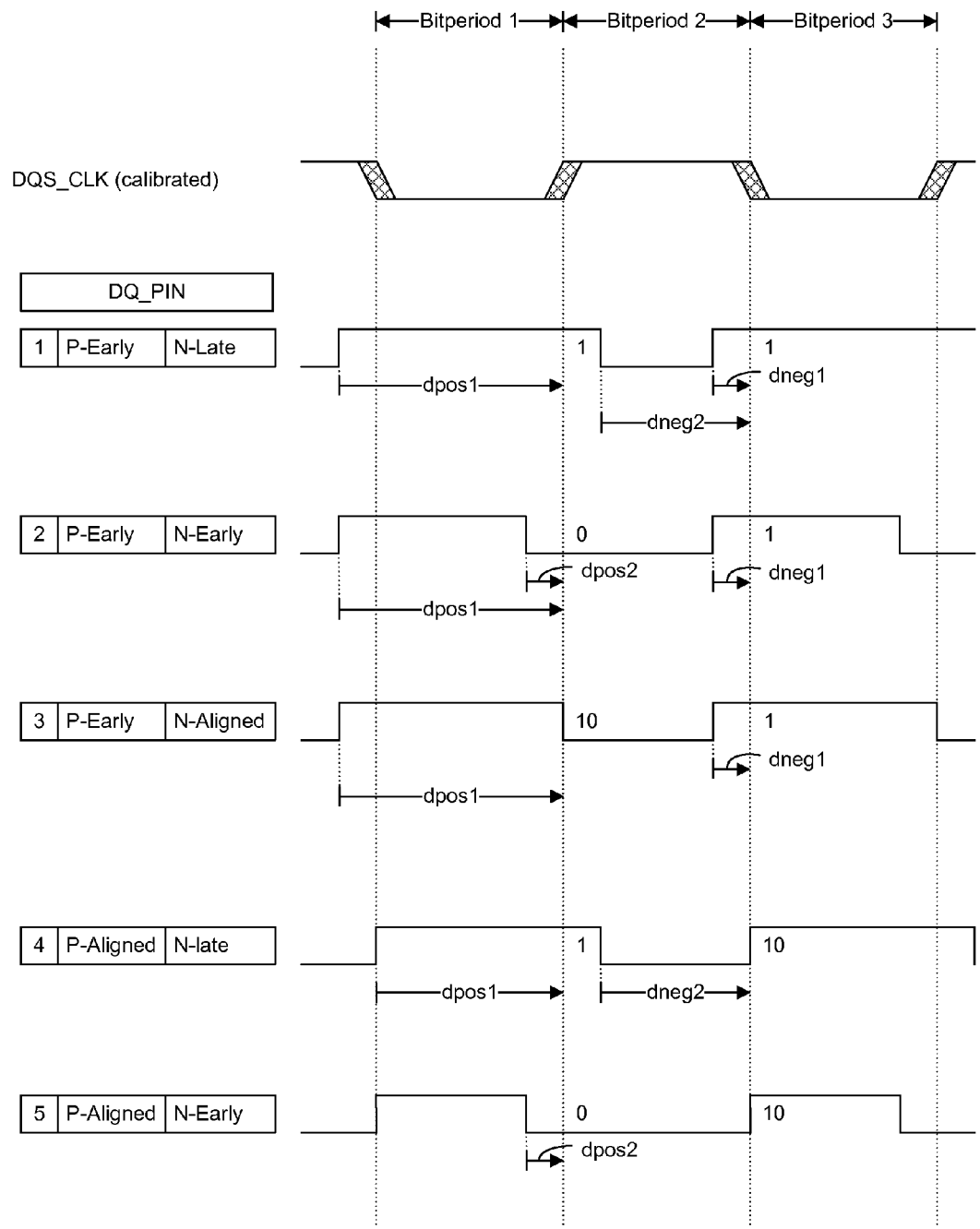
FIGS. 11A and 11B are signal diagrams that, taken collectively, illustrate delay measurement techniques in accordance with another embodiment of the present invention.
Figure 11B:
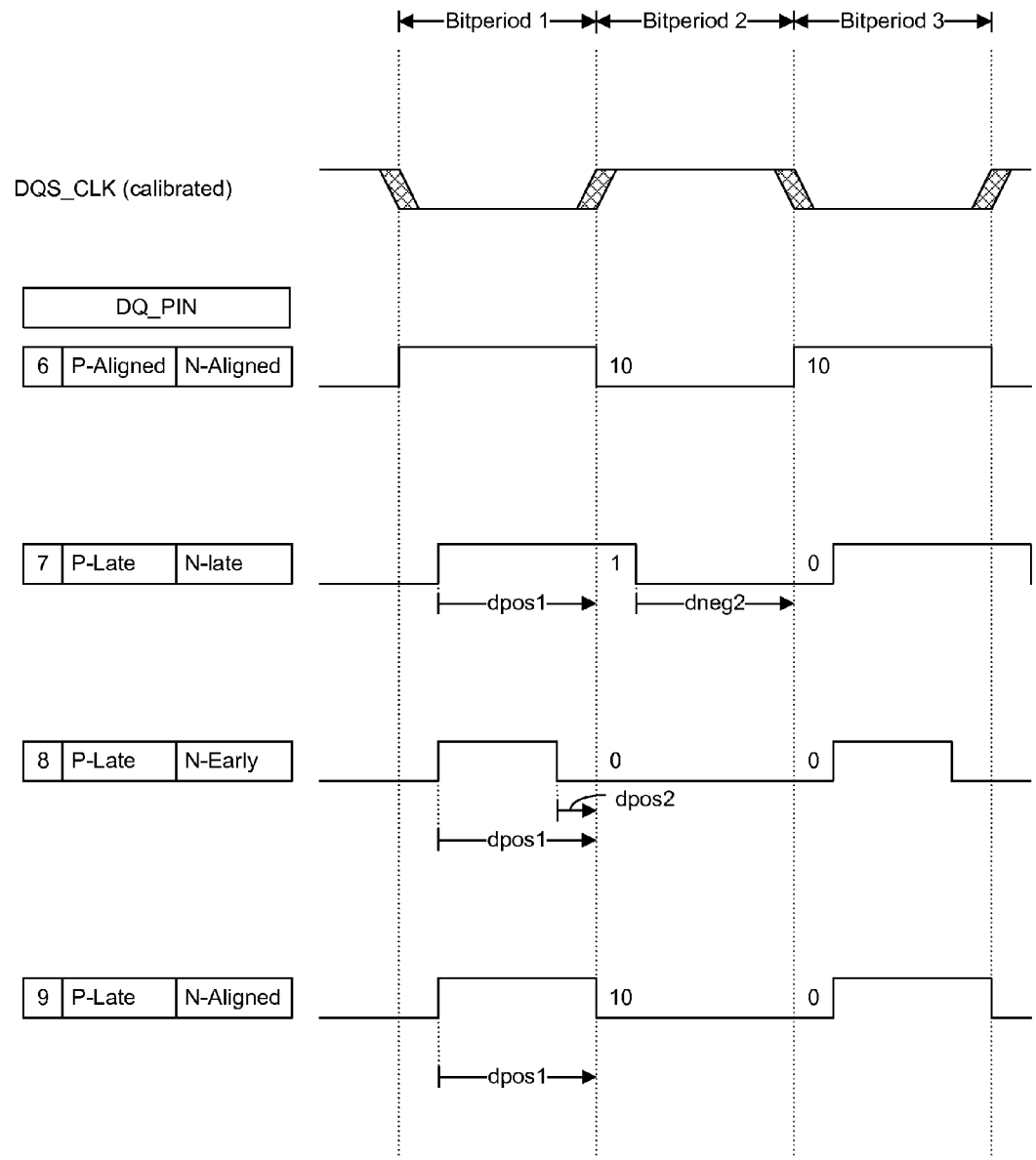

FIGS. 11A and 11B are signal diagrams that, taken collectively, illustrate delay measurement techniques in accordance with another embodiment of the present invention. FIGS. 11A and 11B illustrate the measurement of different delays that can be used to adjust the DQ signals according to the classification determined with reference to FIG. 10. The various delay quantities can encompass a jitter quantity that can be incorporated to account for jitter that is illustrated on DQS_CLK using cross-hatching. The delay operations described can be performed using calibrated DQS and/or DQS_CLK.

FIGS. 11A and 11B illustrate how to measure the delay quantities "dpos1," "dpos2," "dneg1," and "dneg2." It should be appreciated that each of delay quantities "dpos1," "dpos2," "dneg1," and "dneg2" can be measured using the techniques described within this specification. For example, using the system illustrated in FIG. 6, the delay applied to the DQ signal can be increased and the number of taps applied to the DQ signal (e.g., in this case to both the positive and negative edges of the DQ signal) can be determined when the values observed for DQP and/or DQN, as the case may be, changes to a desired state over the plurality of clock cycles for which DQP and DQN each is observed after each adjustment to the tap setting for the DQ signal.

In general, the quantity "dpos1" refers to the delay, in terms of the number of taps, needed to shift the positive edge of a DQ signal to the positive edge of DQS_CLK. The quantity "dpos2" refers to the delay needed to shift the negative edge of a DQ signal to the positive edge of DQS_CLK. The quantity "dneg1" refers to the delay needed to shift positive edge of a DQ signal to the negative edge of DQS_CLK. The quantity "dneg2" refers to the delay needed to shift the negative edge of a DQ signal to the negative edge of DQS_CLK.

In general, when determining the delay quantities, edges of the DQ signal can be delayed until the relevant edge of the DQ signal is aligned with the relevant edge of DQS_CLK. This condition is generally met when a mix of ones and zeros are determined for DQN or DQP, as the case may be, for a given set of "N" samples of the DQ signal. In order to move the edge of a DQ signal to the center of the jitter window of DQS_CLK, however, memory controller block 305 can determine when the number of zeros and ones shifts.

For example, consider classification one (1) (P-Early, N-Late) where the positive edge of a DQ signal is being delayed to the positive edge of DQS_CLK, e.g., where dpos1 is measured. After each tap setting adjustment to the positive edge of the DQ signal, a plurality of samples can be taken, e.g., a set of "N" samples where "N" is an integer such as 16. For each sample of the set, DQP can be evaluated. The positive edge of the DQ signal can be continually delayed until, in general, both zeros and ones are detected for DQP indicating that the positive edge of the DQ signal is generally aligned with the positive edge of DQS_CLK. More particularly, the positive edge of the DQ signal is within the jitter region surrounding the positive edge of DQS_CLK.

It is desirable, however, to place the positive edge of the DQ signal within the center of the jitter region surrounding the positive edge of DQS_CLK. Initially, as the DQ signal is delayed, both ones and zeros are detected for DQP where ones outnumber zeros (e.g., the average number of DQP=1 exceeds the average number of DQP=0) within each set of sampled values as the delay causes some zeros to be captured from initially capturing ones. As the tap setting applied to the positive edge of the DQ signal is increased, a "tipping" point is reached where, within a set of samples, zero DQP values begin to outnumber one DQP values. This change in state from detecting more ones than zeros to more zeros than ones indicates that the center of the jitter region has been crossed. As such, the tap setting can be selected as the current tap setting or the current tap setting minus one tap, e.g., the immediately prior tap setting applied to the selected edge. In this manner, edges of DQ signals can be moved to the center of the jitter region surrounding edges of DQS_CLK. Appreciably, if the number of zeros and ones is equal, the tap setting can be used as is, though such a condition is atypical. Depending upon the particular edge of the DQ signal being moved and the particular edge of DQS_CLK to which the edge of the DQ signal is being moved, memory controller 305 can monitor for transitions from detecting more zeros than ones to more ones than zeros and vice versa for either DQN or DQP as the case may be. By monitoring for transitions, the relevant edge of the DQ signal is placed within the center of the jitter region.

Classifications 3, 4, 5, 6, and 9 include at least one edge of a DQ signal that is aligned with an edge of DQS_CLK. It should be appreciated that only in the atypical case will the number of ones and zeros in a given sample set be equal. In other cases, when the number of zeros outnumbers the number of ones or when the number of ones outnumbers the number of zeros, the DQ signal may not be considered edge aligned, but rather early or late depending upon the sampled values. For example, referring to FIG. 10, when more zeros than ones are detected, the value can be considered a zero.

Similarly, for purposes of classification, when more ones than zeros are detected, the value can be considered a one. In such cases, the delay quantities noted can be measured as illustrated according to the classifications in FIGS. 11A and 11B, though the values determined for particular delay quantities will be either close to zero or close to a full bitperiod.

It should be appreciated that not all delay quantities are needed in order to calibrate each different signal classification. The delay quantities are shown in FIGS. 11A and 11B for purposes of illustration. For example, in one embodiment, the system can be configured to constantly determine the various delay quantities "dpos1," "dpos2," "dneg1," and "dneg2" so that each is available whether needed or not for purposes of calibrating DQ signals.

FIG. 12 is a table 1200 illustrating delay to be applied to positive and negative edges of data signals according to the classifications of FIG. 10 in accordance with another embodiment of the present invention. Table 1200 utilizes the delay quantities illustrated in FIGS. 11A-11B. Table 1200 illustrates the amount of delay that is to be applied to the positive and negative edge of DQ signals organized according to the nine classifications of DQ signals illustrated in FIG. 10 to achieve calibration so that the DQ signals transition as illustrated in FIG. 5. Taking DQ signal classification three as an example, the DQ signal is P-Early, N-Aligned. DQ classification three is characterized by detecting both 1 and 0 for DQP over the period of time that the DQ signal is sampled and consistently detecting only 1 for DQN.

The positive edge of the DQ signal can be delayed according to the expression "(MTS/2)+dneg1" of table 1200 using the value of "dneg1" illustrated in FIG. 11A. Within each expression in table 1200, the term "MTS" refers to the maximum tap setting. The negative edge of the DQ signal can be delayed according to the expression "(MTS/2)" from table 1200. Accordingly, each of the DQ signals DQ<0>-DQ<N> can be calibrated using the expressions shown in table 1200 based upon the identified classification of the DQ signal. The calibration of the DQ signals accounts for jitter that is present on DQS_CLK.

Once the DDR signals are calibrated, re-calibration may be necessary from time to time. Variations in temperature and/or voltage within the programmable IC can cause the amount of delay provided by a tap of the delay circuits 602-606 to vary, thereby causing signals to become misaligned. The amount of delay provided by a single tap, for example, can vary from as little as approximately 25 picoseconds up to, in some cases, approximately 200 picoseconds depending upon voltage and temperature conditions within programmable IC 300. One can see that the amount of delay applied to a signal, particularly when more than one tap is applied, can vary significantly with voltage and temperature conditions. In consequence, it becomes necessary to adjust the tap settings of a delay circuit over time to ensure that the amount of delay applied to the input signal remains relatively constant as the amount of delay provided per tap varies. Regarding DQS, for example, DQS should remain delayed with respect to DQS_PIN by a bitperiod as illustrated in FIG. 9E, for example.

FIGS. 13A and 13B are signal diagrams that, taken together, illustrate dynamic calibration of a signal in accordance with another embodiment of the present invention. More particularly, FIGS. 13A and 13B illustrate a technique for dynamically adjusting DQS with respect to DQS_PIN after initial calibration has been performed. The amount by which signals drift, however, is relatively small with little or no large shifts in timing occurring at any one time, e.g., no step functions in terms of tap delay variation. Thus, DQS can be incrementally adjusted using a single tap at a time as described below to maintain the proper alignment between DQS_PIN and DQS.

Within FIG. 13A, using the system described with reference to FIG. 6, DQS_PIN can be sampled as DQS_Data, with the sampling operations being clocked by DQS_CLK. As shown, on the rising edge of DQS_CLK, a logic high is sampled from DQS_Data indicating that the rising edge of DQS_CLK leads DQS_Data in time. Accordingly, the delay applied to the rising edge of DQS by delay circuit 602 can be increased by one tap. Similarly, sampling a logic low on the falling edge of DQS_CLK indicates that the falling edge of DQS_CLK leads DQS_PIN. Accordingly, the delay applied to the falling edge of DQS by delay circuit 602 can be increased by one tap.

Within FIG. 13B, again using the system described with reference to FIG. 6, DQS_PIN can be sampled as DQS_Data, with the sampling being clocked by DQS_CLK. As shown, on the rising edge of DQS_CLK, a logic low is sampled from DQS_PIN indicating that the rising edge of DQS_CLK lags DQS_PIN in time. Accordingly, the delay applied to the rising edge of DQS by delay circuit 602 can be decreased by one tap. Similarly, sampling a logic high on the falling edge of DQS_CLK indicates that the falling edge of DQS_CLK lags DQS_PIN. Accordingly, the delay applied to the falling edge of DQS by delay circuit 602 can be decreased by one tap.

FIG. 14 is a flow chart illustrating a method 1400 of dynamically calibrating signals in accordance with another embodiment of the present invention. More particularly, FIG. 14 illustrates a method of dynamically calibrating DQS_CLK with respect to DQS_PIN as illustrated with reference to FIGS. 13A and 13B. Method 1400 illustrates a method of dynamically calibrating and/or maintaining calibration of DQS that does not require the normal operation of memory controller block 305 or memory device 360 to be paused.

In one embodiment, method 1400 can be performed responsive to a read operation. When a read operation is detected, DQS_CLK can be compared with DQS_PIN as described. At the conclusion of the read operation, the amount of delay applied to DQS can be adjusted as described. Accordingly, method 1400 can begin in step 1405, where a read operation is detected. In step 1410, the end of the read operation can be detected. Responsive to the end of the read operation, in step 1415, values for DQS_Data can be determined on the positive edge and on the negative edge of DQS_ CLK. In step 1420, the tap setting for DQS_CLK can be adjusted according to the values determined for DQS_Data in step 1415 as illustrated in FIG. 14. It should be appreciated that because DQS varies from DQS_CLK by the internal delay of clock network 614, adjusting DQS also adjusts DQS_ CLK.

Figure 15:
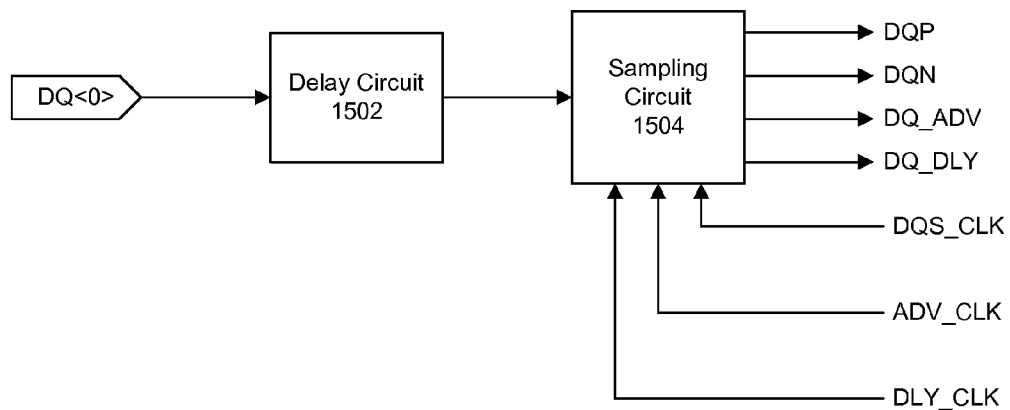
FIG. 15 is a block diagram illustrating a circuit architecture for dynamic calibration of a signal in accordance with another embodiment of the present invention.

FIG. 15 is a block diagram illustrating a circuit architecture for dynamic calibration of a signal in accordance with another embodiment of the present invention. As shown, the system illustrated in FIG. 15 includes a delay circuit 1502 that receives DQ<0>. Delay circuit 1502 can function substantially as described within this specification. As such, delay circuit 1502 can include two different tap settings. The first tap setting can regulate the delay applied by delay circuit 1502 to the positive edge of DQ<0>. The second tap setting can regulate the delay applied by delay circuit 1502 to the negative edge of DQ<0>.

As shown, three different clocking signals are used to clock sampling circuit 1504. Sampling circuit 1504 can include a plurality of FFs capable sampling DQ<0> on the rising and falling edges of each received clock signal DQS_CLK, ADV_CLK, and DLY_CLK. ADV_CLK and DLY_CKL can be generated from the calibrated DQS_CLK. More particularly, ADV_CLK and DLY_CLK can be generated by delaying DQS_CLK by one-half of a bitperiod plus/minus a small, predetermined adjustment or number of taps, e.g., 1, 2, 3, 4, 5, 10, 20, or more. The result is that ADV_CLK will have edge transitions that occur immediately, e.g., a predetermined amount of time, prior to the midpoint between disparate edges (positive/negative and/or negative/positive) of DQS_CLK, and thus, immediately prior to the point in time that DQ<0> is expected to transition. Similarly, DLY_CLK can be delayed so that the edges transition immediately, e.g., a predetermined amount of time, subsequent to the midpoint between disparate edges of DQS_CLK, and thus, immediately after the point in time that DQ<0> is expected to transition.

Sampling circuit 1504 can provide output signals DQP, DQN, DQ_ADV, and DQ_DLY. DQP and DQN have been discussed. DQ_ADV specifies the value of DQ<0> that is sampled according to ADV_CLK. DQS_CLK specifies the value of DQ<0> that is sampled according to DLY_CLK. Though not illustrated for ease of illustration, DQ_ADV can indicate, e.g., serially or as a plurality of parallel signals, the value of DQ<0> sampled on both positive and negative edges of ADV_CLK. Likewise, DQ_DLY can indicate the value of DQ<0> sampled on both the positive and negative edges of DLY_CLK. It should be appreciated that a same type of circuit architecture can be used for each DQ signal thereby facilitating alignment of DQ signals as described with reference to DQ<0>. Further, though not shown, memory controller block 305, for example, can coordinate the various actions described in terms of evaluating DQP, DQN, DQ_ADV, and DQ_DLY.

Figure 16:
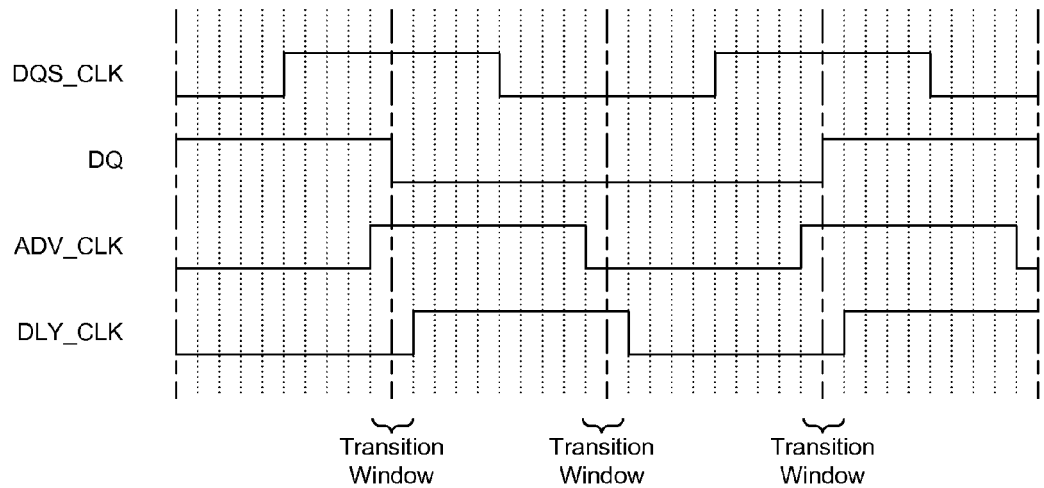
FIG. 16 is a signal diagram illustrating timing relationships among clock signals described with reference to FIG. 15 in accordance with another embodiment of the present invention.

FIG. 16 is a signal diagram illustrating timing relationships among clock signals described with reference to FIG. 15 in accordance with another embodiment of the present invention. More particularly, FIG. 16 illustrates the relationship between DQS_CLK, DQ<0>, ADV_CLK, and DLY_CLK. As illustrated, ADV_CLK and DLY_CLK, by virtue of the timing of the positive and negative edges of each respective signal, form a transition window. More particularly, each consecutive pair of consecutive positive edges of ADV_CLK and DLY_CLK form transition windows. Similarly, each pair of consecutive negative edges of ADV_CLK and DLY_CLK form a transition window. If DQ<0> transitions, the transition, when DQ<0> is aligned properly, occurs within a transition window. Appreciably, DQ<0> may not transition during each consecutive transition window. When DQ<0> does transition, however, the transition should not occur prior to or after the transition window.

FIG. 17 is a table 1700 illustrating various states for the signals illustrated with respect to FIGS. 15 and 16 in accordance with another embodiment of the present invention. More particularly, table 1700 illustrates the state of signals DQP, DQN, DQ_ADV, and DQ_DLY and the type of action to take in terms of the delay to be applied to the positive and negative edges of DQ<0> for cases 1-16. As illustrated, DQ signals are adjusted only for cases 5, 8, 9, and 12. Table 1700 illustrates an action to be taken for each edge of DQ<0> according to the particular values observed for DQP, DQN, DQ_ADV, and DQ_DLY. For example, for case 5, when DQP=0, DQN=1, DQ_ADV=0, and DQ_DLY=0 on the positive edge of DQS_CLK, the tap setting, and thus delay, for the most recently detected edge type (e.g., positive or negative) of DQ is incremented by one tap. Similarly, when the same condition is detected on a negative edge of DQS_CLK, the tap setting, and thus delay, applied to the most recently detected edge type for DQ is decremented by one tap.

Figure 18:
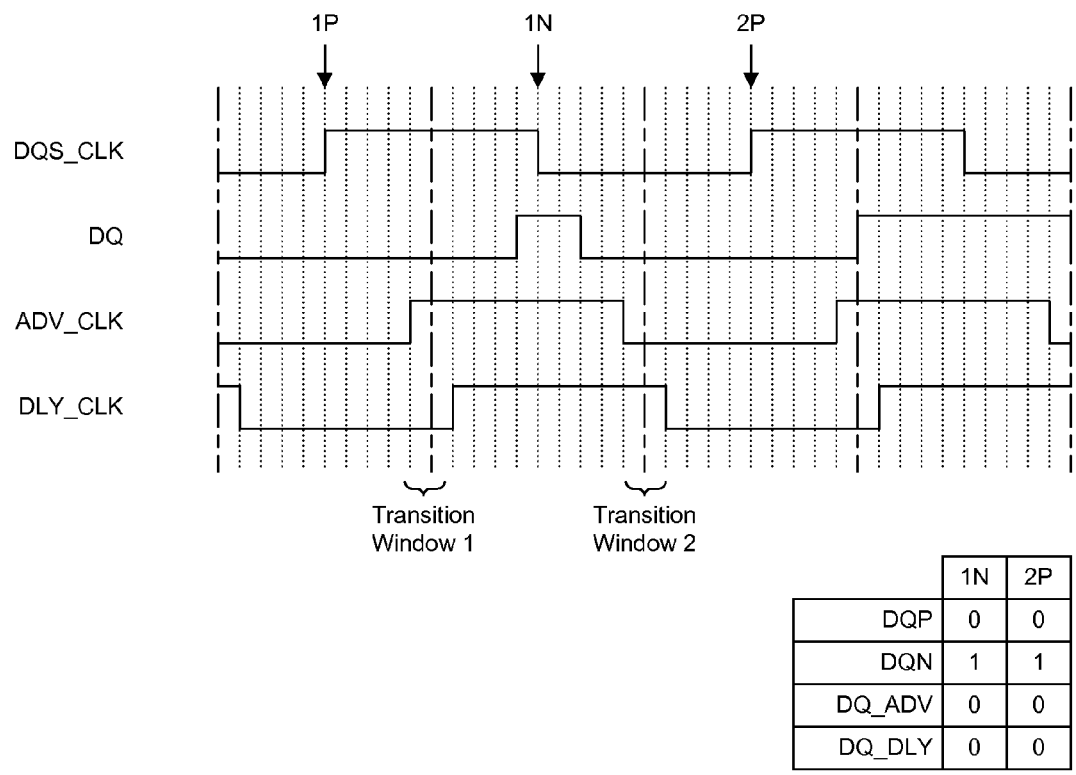
FIG. 18 is a signal diagram illustrating an example of dynamic signal calibration in accordance with another embodiment of the present invention.

FIG. 18 is a signal diagram illustrating case 5 of FIG. 17 in accordance with another embodiment of the present invention. The first negative edge of DQS_CLK is illustrated as "1N." As shown, DQP indicates that DQ was a logic low at 1P, while DQN indicates that DQ was a logic high at 1N. Thus, DQ transitioned from a logic low to a logic high. DQ_ADV and DQ_DLY, however, both indicate that DQ remained at a logic low and, thus, did not transition high until after transition window 1. Accordingly, as indicated in Table 1700, on the negative edge of DQS_CLK, the delay applied to DQ is decremented by one tap.

At the second negative edge of DQS_CLK denoted as "2P," DQP indicates that DQ is a logic low. DQN, which shows the value of DQ at 1N of DQS_CLK, indicates that DQ was a logic high. Thus, DQ transitioned from a logic high to a logic low. DQ_ADV and DQ_DLY both again indicate that DQ was at a logic low. Thus, DQ transitioned low prior to transition window 2. Accordingly, the delay applied to DQ should be increased by one tap.

Figure 19A:
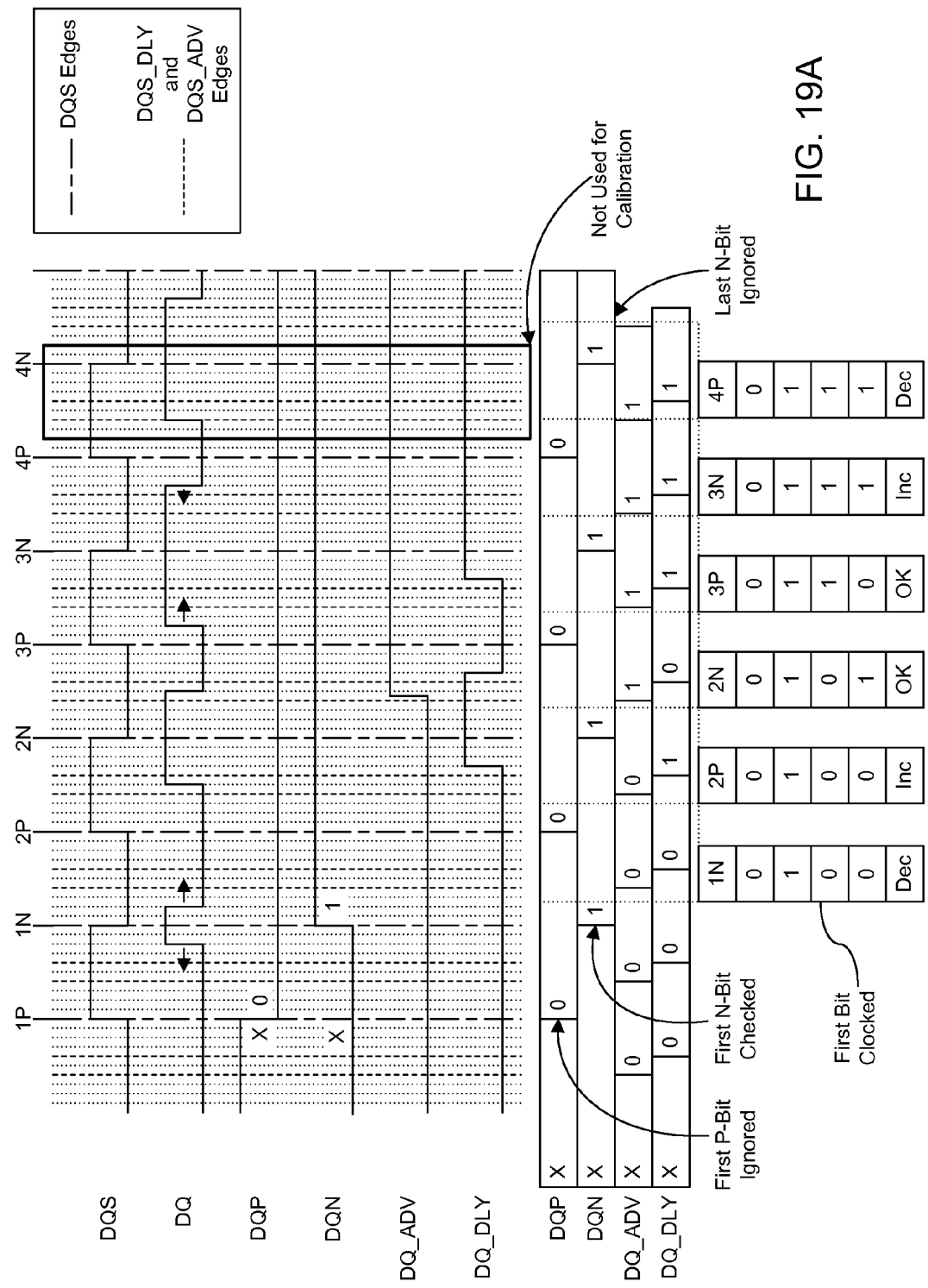
FIGS. 19A-19C are signal diagrams that, taken collectively, illustrate various states of signals for dynamic signal calibration in accordance with another embodiment of the present invention.
Figure 19B:
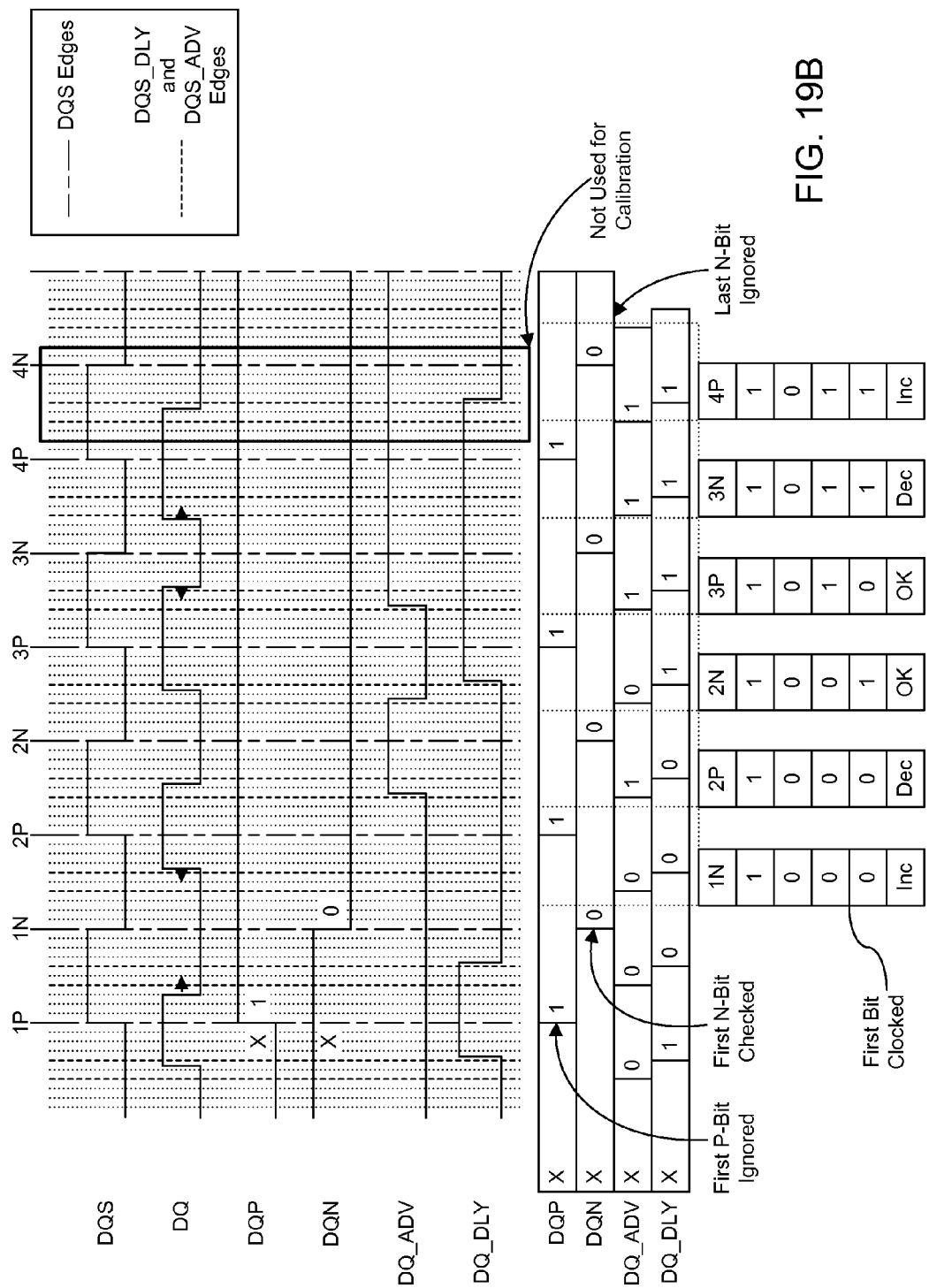
Figure 19C:
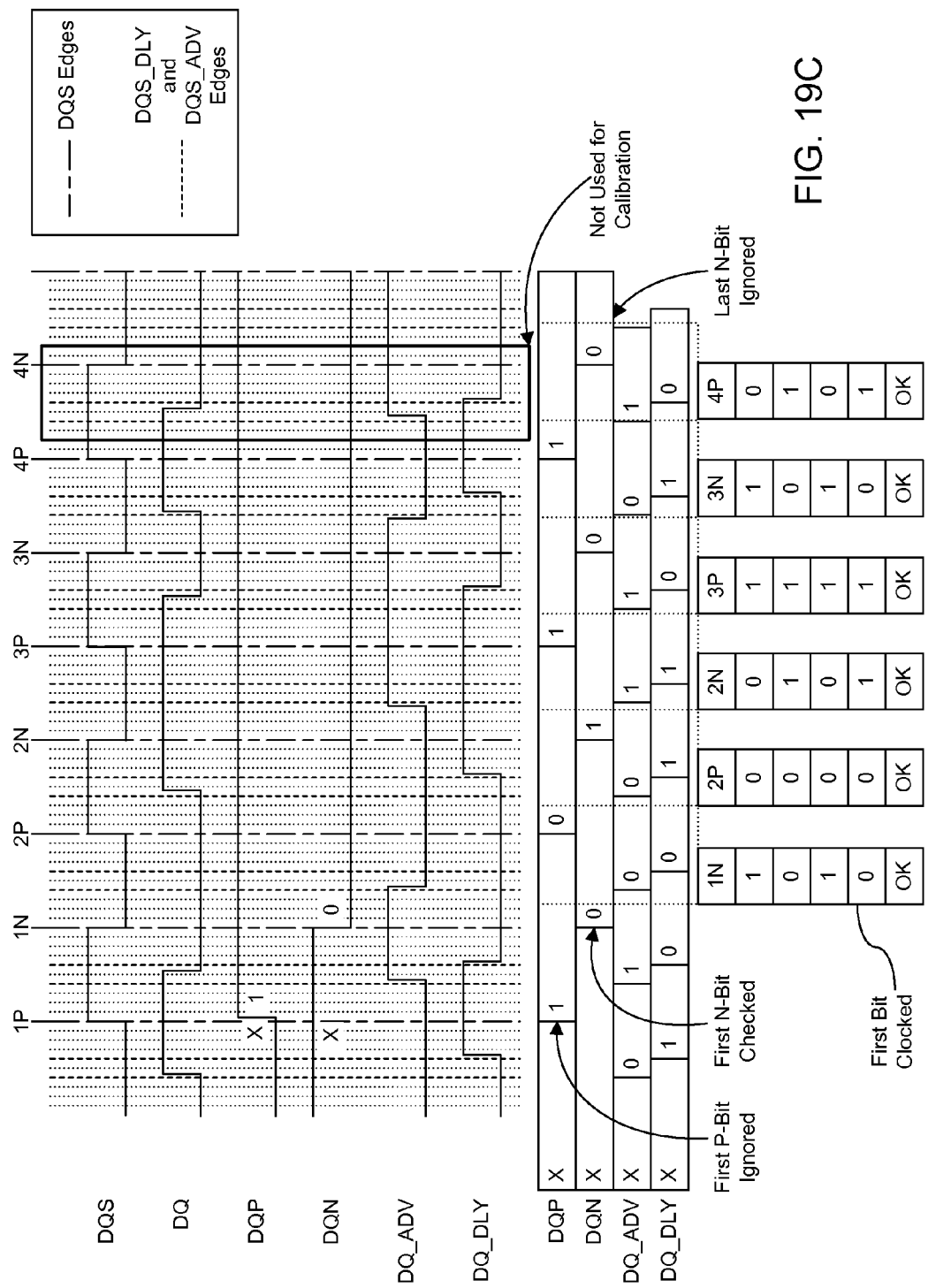

FIGS. 19A-19C are signal diagrams that, taken collectively, illustrate various states of signals for dynamic signal calibration in accordance with another embodiment of the present invention. More particularly, FIGS. 19A-19C illustrate additional states for signals DQ and DQS_CLK in addition to the values captured for DQP, DQN, DQ_ADV, and DQ_DLY as shown in table 1700 of FIG. 17. FIGS. 19A-19C further illustrate which of the various bits and/or values are ignored for purposes of calibration. The legend indicates which vertical lines correspond to edges for DQS_CLK and the time when DQS_ADV and DQS_DLY transition, e.g., the timing of positive and negative edges of DQS_ADV and DQS_DLY (not shown).

As noted, the delay applied to each DQ signal can be modified or adjusted according to the values stored for DQN, DQP, DQ_ADV, and DQ_DLY for both the last positive edge and the last negative edge of DQS_CLK. Referring to each of FIGS. 19A-19C, the action to be taken is the action specified for the times 3N and 4P as opposed to any initial or intermediate determinations corresponding to 1N, 2P, 2N, or 3P, for example. Thus, any timing adjustments determined for times 1N, 2P, 2N, or 3P, for example, are effectively overruled by the determination made as 3N and 4P. The horizontal arrows illustrate the delay adjustments performed to positive and negative edges of the DQ signal to maintain edges within the transition windows described with reference to FIG. 18.

Figure 20:
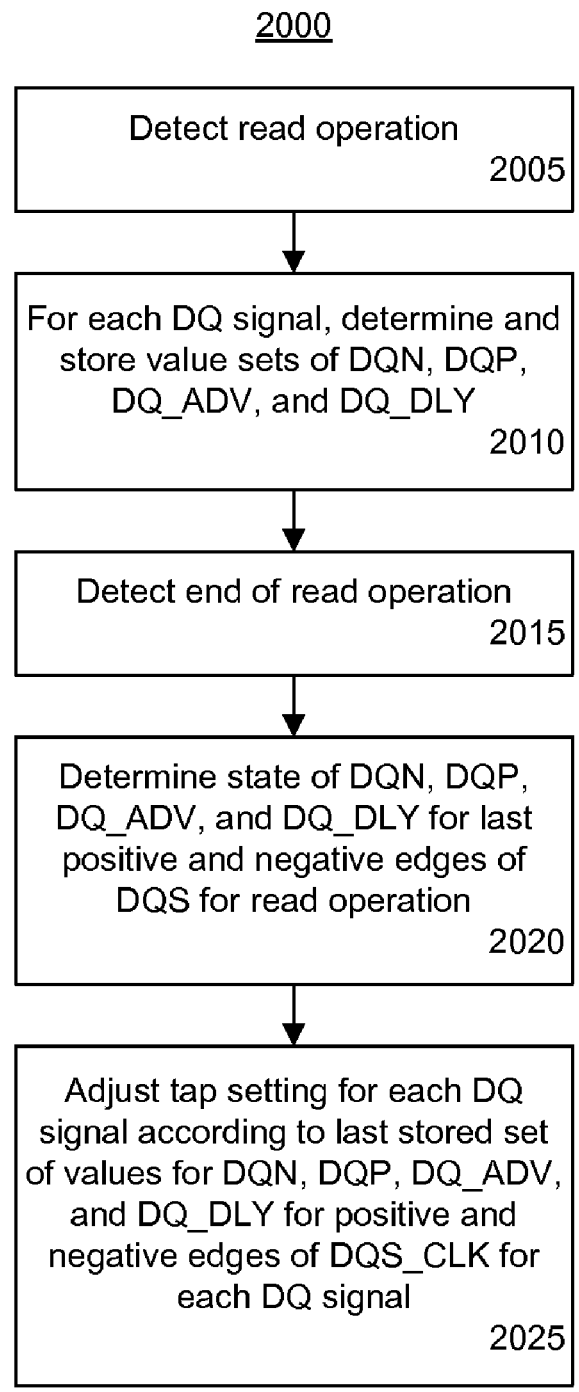
FIG. 20 is a flow chart illustrating a method of dynamically calibrating signals in accordance with another embodiment of the present invention.

FIG. 20 is a flow chart illustrating a method 2000 of dynamically calibrating signals in accordance with another embodiment of the present invention. More particularly, FIG. 20 illustrates a method 2000 of dynamically calibrating DQ signals using the DQS_ADV and DQS_DLY clock signals in combination with the DQS as described with reference to FIGS. 15-19. Method 2000 illustrates a method of dynamically calibrating and/or maintaining calibration of DQ signals with respect to DQS that does not require the normal operation of memory controller block 305 or memory device 360 to be paused. Method 2000 can be performed by a system as described with reference to FIGS. 6 and 15.

Method 2000 can begin in step 2005, where a read operation is detected. In step 2010, responsive to detecting the read operation, the system can begin determining values for each DQ signal on the positive and negative edges of DQS, DQS_ADV, and DQS_DLY. For each DQ signal, values of DQN, DQP, DQ_ADV, and DQ_DLY can be determined and stored. A plurality of value sets can be stored. For purposes of calibrating DQ signals, the first rising edge of a DQ signal is ignored since a known value for DQN does not yet exist.

Similarly, the last negative edge of a DQ signal is omitted since a value for DQ has not been clocked according to DQS_ADV yet.

In step 2015, the system can detect the end of the read operation. In step 2020, responsive to detecting the end of the read operation, the state of each DQ signal can be determined for the last positive edge of DQS and for the last negative edge of DQS. In step 2025, the delay applied to each DQ signal can be modified or adjusted according to the values stored for DQN, DQP, DQ_ADV, and DQ_DLY for both the last positive edge and the last negative edge of DQS with reference to Table 1800.

It should be appreciated that while different sets of values for DQN, DQP, DQ_ADV, and DQ_DLY can be captured throughout the read operation for each DQ signal, the tap setting for each DQ signal is only modified according to the last positive edge and last negative edge of DQS stored for the read operation for that DQ signal. Thus, if interim values of DQN, DQP, DQ_ADV, and DQ_DLY for DQ<0>, for example, indicate a change in the delay according to table 1700, but the last stored set of values for DQN, DQP, DQ_ADV, and DQ_DLY indicate that no change in the delay should be made, the delay for DQ<0> is not changed. Similarly, if interim values of DQN, DQP, DQ_ADV and DQ_DLY for DQ<0>, for example, indicate that no change in the delay is required per table 1700, but the last stored values for DQN, DQP, DQ_ADV, and DQ_DLY indicate that a change in the delay is necessary, then the change is implemented.

As discussed, one or more embodiments described with reference to FIGS. 13-20 can be performed responsive to a read operation, e.g., at the conclusion of the read operation, selected read operations, or each read operation as the case may be. Accordingly, it should be appreciated that the dynamic calibration techniques described can be performed after each time period that is equal to, at most, e.g., a worst case scenario, the amount of time needed to read the entirety of memory device 360. Appreciably, typical read operations do not read the entirety of memory device 360. Thus, in the typical case, the dynamic calibration techniques described can be performed more often than the worst case scenario described.

Figure 21:
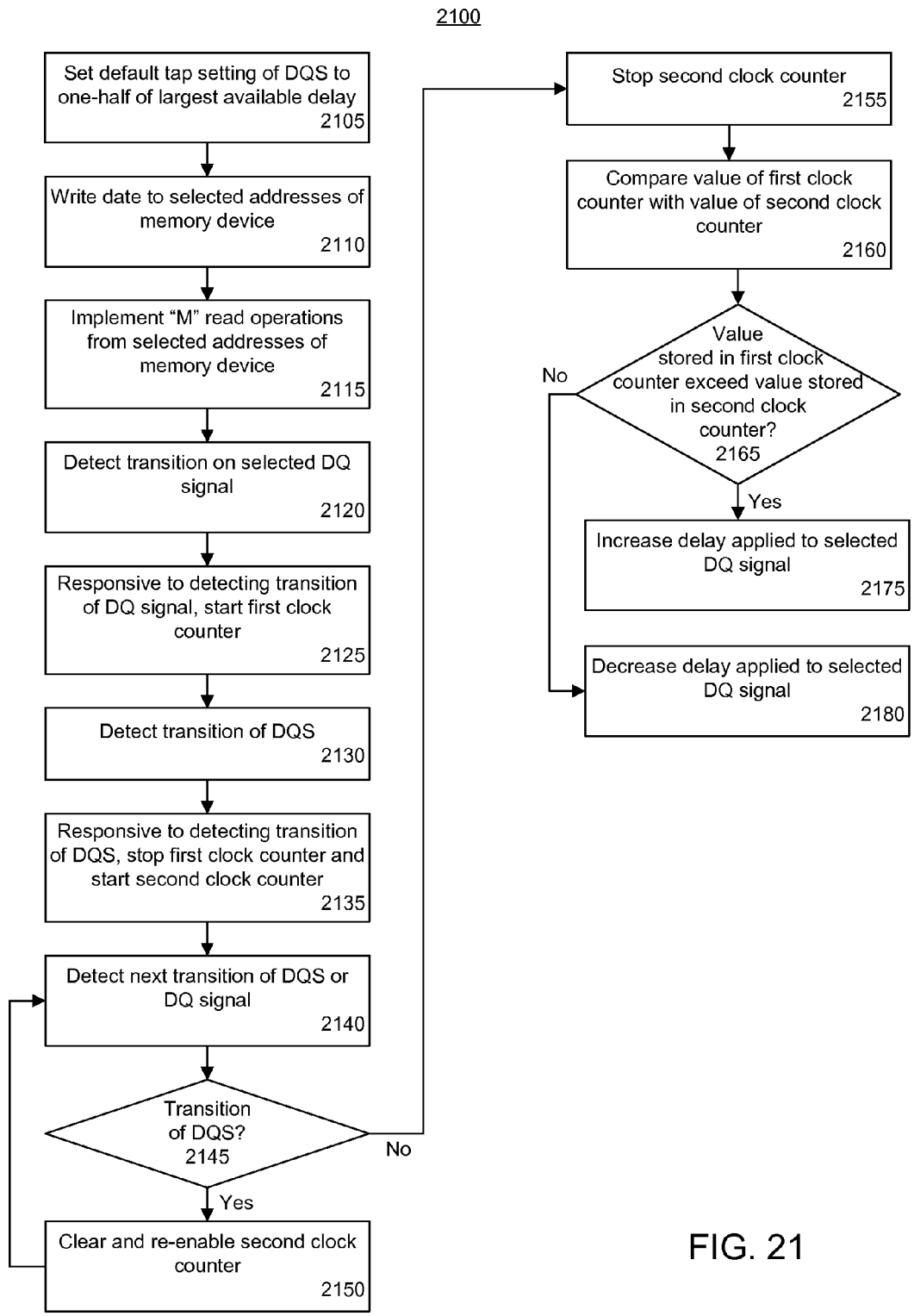
FIG. 21 is a flow chart illustrating a method of dynamically calibrating signals in accordance with another embodiment of the present invention.

FIG. 21 is a flow chart illustrating a method 2100 of dynamically calibrating signals in accordance with another embodiment of the present invention. Method 2100 illustrates a method of dynamically calibrating and/or maintaining calibration of DQ signals with respect to DQS that does not require the normal operation of memory controller block 305 or memory device 360 to be paused. Method 2100 can be performed by a system as described within this specification to maintain proper phase between DQ signal and DQS. First and second clock counters can be incorporated within memory controller block 305 as described in FIG. 6.

Method 2100 can begin in step 2105, where memory controller block 305 sets a default tap setting of DQS to one-half of the largest available delay. In step 2110, memory controller block 305 can write to selected addresses of memory device 360. In step 2115, memory controller block 305 can initiate "M" read operations from the selected addresses of memory device 360, where "M" is an integer value. In one embodiment, a pattern of alternating zeros and ones can be written to the selected address and read from the selected addresses. It should be appreciated, however, that writing such a data pattern, while causing method 2100 to converge more rapidly than using other data patterns, is not required and other data can be written other than the alternating patter of zeros and ones. Accordingly, any user-initiated read operation can be used with method 2100 to calibrate DQ signals with respect to DQS.

The remaining steps of method 2100 can be performed while memory controller block 305 performs the "M" read operations described in step 2115. Accordingly, in step 2120, memory controller block 305 can detect a transition, e.g., either a positive or a negative edge, on a selected DQ signal. In step 2125, memory controller block 305 can start the first clock counter. The first clock counter can count edges on a high frequency signal such as a ring oscillator, a delay locked loop, or phase locked loop that is internally generated within programmable IC 300 and operates at a frequency that is faster than that of DQS. For example, a high frequency signal as described with reference to the delay circuits of FIG. 6 can be used.

In step 2130, memory controller block 305 can detect a transition of DQS. Accordingly, in step 2135, responsive to detecting the transition of DQS, memory controller block 305 can stop the first clock counter and start the second clock counter. In step 2140, memory controller block 305 can detect a next transition of either DQS or the selected DQ signal. Accordingly, in step 2145, memory controller block 305 can determine whether the next detected transition is a transition of DQS. If so, method 2100 can proceed to step 2150, where the second clock counter is cleared and then enabled, or re-enabled as the case may be. In one embodiment, the re-enablement of the second clock counter can include starting the second clock counter. After step 2150, method 2100 can loop back to step 2140. When the next detected transition is determined to be of the selected DQ signal in step 2145 and not a transition of DQS, method 2100 can proceed to step 2155. In step 2155, the second clock counter can be stopped.

Continuing with step 2160, memory controller block 305 can compare the value stored in the first clock counter with the value stored in the second clock counter. In step 2165, memory controller block 305 determines whether the value stored in the first clock counter exceeds the value stored in the second clock counter. When the value stored in the first clock counter exceeds the value stored in the second clock counter, method 2100 proceeds to step 2175 and increases the delay applied to the selected DQ signal by one tap. When the value stored in the first clock counter does not exceed the value stored in the second clock counter, method 2100 proceeds to step 2180 and decreases the delay applied to the selected DQ signal by one tap.

Method 2100 can be repeated as may be required until the "M" read operations have concluded, at which point the selected DQ signal is placed back into the proper phase with regard to DQS as illustrated in FIG. 5. It should be appreciated that method 2100 can be performed for each DQ signal either serially or in parallel, e.g., concurrently.

One or more embodiments disclosed within this specification provide methods, systems, and apparatus relating to calibrating memory controller signals at startup of the memory controller and/or IC comprising the memory controller. The calibration, as described, can account for internal clock delay within the IC, provide duty cycle correction, and account for jitter within the clock signal. One or more embodiments disclosed herein further provide methods, systems, and apparatus relating to dynamic calibration, e.g., maintaining calibration, of memory controller signals post an initial calibration procedure. The dynamic techniques described allow calibration of memory controller signals to be maintained without having to undergo a time consuming process in which normal operation of the memory controller is paused.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

Embodiments of the present invention can be realized in hardware or a combination of hardware and software. One or more embodiments can be realized in a centralized fashion in one system or in a distributed fashion where different elements are spread across several interconnected systems. Any kind of data processing system or other apparatus adapted for carrying out the methods described herein is suited.

Embodiments of the present invention further can be embedded in a device such as a computer program product, which comprises all the features enabling the implementation of the methods described herein. The device can include a data storage medium, e.g., a computer-usable or computer-readable medium, storing program code that, when loaded and executed in a system comprising memory and a processor, causes the system to perform the functions described herein or to instantiate system(s) as described herein within an IC and/or a programmable IC. Examples of data storage media can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed herein can be embodied in other forms without departing from the spirit or essential attributes thereof. Accordingly, reference should be made to the following claims, rather than to the foregoing specification, as indicating the scope of one or more embodiments of the present invention.

What is claimed is:

1. A method of calibrating memory controller signals within an integrated circuit (IC), comprising:
    determining an internal delay of a clock network of the IC;
    generating a calibrated clock signal by applying a first delay to an uncalibrated clock signal, wherein the first delay is determined by subtracting the internal delay of the clock network of the IC from a bitperiod of the uncalibrated clock signal;
    determining a classification of at least one data signal according to timing of positive and negative edges of the at least one data signal in comparison with edges of the calibrated clock signal; and
    aligning at least one of positive or negative edges of the at least one data signal to occur at midpoints between edges of the calibrated clock signal according to the classification of the at least one data signal.

2. The method of claim 1, further comprising:
    first determining the internal delay of the clock network comprising:
        generating a delayed version of the uncalibrated clock signal that is delayed by the internal delay of the clock network;
        sampling the uncalibrated clock signal by clocking the sampling using the delayed version of the uncalibrated clock signal to determine sampled values of the uncalibrated clock signal; and
        applying a second delay to the uncalibrated clock signal and increasing the second delay until the sampled values change state, wherein the second delay approximates the internal delay of the clock network.

3. The method of claim 1, further comprising:
    identifying a type of duty cycle distortion on the uncalibrated clock signal; and
    implementing a duty cycle correction procedure according to the type of duty cycle distortion identified.

4. The method of claim 1, wherein determining a classification of the at least one data signal comprises:
    determining whether the positive edges of the at least one data signal are early, late, or aligned with edges of the calibrated clock signal; and
    determining whether the negative edges of the at least one data signal are early, late, or aligned with edges of the calibrated clock signal.

5. The method of claim 4, wherein aligning positive and negative edges of the at least one data signal further comprises selecting a delay amount to apply to the positive edges of the data signal and a delay amount to apply to the negative edges of the data signal according to the classification.

6. The method of claim 4, wherein classifying the at least one data signal further comprises:
    sampling a first plurality of values from the at least one data signal on positive edges of the calibrated clock signal;
    sampling a second plurality of values from the at least one data signal on negative edges of the calibrated clock signal;
    determining the classification of the at least one data signal according, at least in part, to whether the first plurality of values comprises at least one of a logic high and a logic low; and
    determining the classification of the at least one data signal according, at least in part, to whether the second plurality of values comprises at least one of a logic high and a logic low.

7. The method of claim 6, further comprising:
    determining the classification of the at least one data signal according, at least in part, to whether each value of the first plurality of values is equivalent; and
    determining the classification of the at least one data signal according, at least in part, to whether each value of the second plurality of values is equivalent.

8. The method of claim 1, wherein aligning positive and negative edges of the at least one data signal further comprises:
    determining a measure of jitter on the clock signal; and
    incorporating the measure of jitter within at least one of the delay amount for the positive edges or the delay amount for the negative edges of the at least one data signal.

9. A method of dynamically calibrating memory controller signals within an integrated circuit (IC), the method comprising:
    sampling an uncalibrated clock signal by clocking the sampling using a calibrated clock signal to determine at least one sampled value of the uncalibrated clock signal, wherein the calibrated clock signal is a calibrated version of the uncalibrated clock signal; and
    adjusting a delay applied to at least one edge of the calibrated clock signal according to the at least one sampled value.

10. The method of claim 9, further comprising:
    incrementing the delay applied to the at least one edge of the calibrated clock signal responsive to determining that the at least one sampled value is a logic high.

11. The method of claim 9, further comprising:
    decrementing the delay applied to the at least one edge of the calibrated clock signal responsive to determining that the at least one sampled value is logic low.

12. The method of claim 9, further comprising:
    generating an advance clock signal that is out of phase with the calibrated clock signal by approximately one fourth of a clock period of the calibrated clock signal, wherein the advance clock signal transitions prior to a midpoint between disparate edges of the calibrated clock signal; and
    generating a delayed clock signal that is out of phase with the calibrated clock signal by approximately one fourth of a clock period of the calibrated clock signal, wherein the delayed clock signal transitions after a midpoint between disparate edges of the calibrated clock signal.

13. The method of claim 12, further comprising:
    during a read operation initiated with a memory device, determining whether the at least one data signal transitions within a transition window defined by like edges of the advance clock and the delayed clock.

14. The method of claim 13, further comprising:
    responsive to detecting a conclusion of the read operation, selectively adjusting a delay applied to the at least one data signal according to whether the at least one data signal transitions within the transition window.

15. The method of claim 12, further comprising:
    during a read operation initiated with a memory device, determining a set of sampled values from the at least one data signal comprising:
        sampling a value of the at least one data signal on positive edges of the calibrated clock;
        sampling a value of the at least one data signal on negative edges of the calibrated clock;

sampling a value of the at least one data signal on a transition of the advance clock; and sampling a value of the at least one data signal on a transition of the delayed clock.

16. The method of claim 15, further comprising, responsive to detecting a conclusion of the read operation, selectively adjusting a delay applied to at least one of the positive edge or the negative edge of the at least one data signal according to the set of sampled values.

17. A method of dynamically calibrating memory controller signals within an integrated circuit (IC), the method comprising:
responsive to detecting a transition of a data signal, starting a first clock counter;
responsive to detecting a transition of a calibrated clock signal, stopping the first clock counter and starting a second clock counter;
selectively clearing and re-enabling the second clock counter or stopping the second clock counter according to whether a next detected transition is a transition of the data signal or a transition of the calibrated clock signal; and
adjusting a delay applied to the data signal according to the value of the first clock counter and the value of the second clock counter responsive to the next detected transition.

18. The method of claim 17, further comprising:
responsive to determining that the next detected transition is a transition of the data signal, stopping the second clock counter; and
responsive to determining that the next detected transition is a transition of the calibrated clock signal, clearing and then re-enabling the second clock counter.

19. The method of claim 18, further comprising:
comparing the value of the first clock counter and the value of the second clock counter responsive to detecting the next detected transition; and
determining whether the value of the first clock counter exceeds the value of the second clock counter.

20. The method of claim 18, further comprising:
increasing a delay applied to the data signal responsive to determining that the value of the first clock counter exceeds the value of the second clock counter; and
decreasing a delay applied to the data signal responsive to determining that the value of the first clock counter does not exceed the value of the second clock counter.

* * * * *